(12) United States Patent
Hsu et al.

(10) Patent No.: US 11,615,962 B2
(45) Date of Patent: Mar. 28, 2023

(54) SEMICONDUCTOR STRUCTURES AND METHODS THEREOF

(71) Applicant: Taiwan Semiconductor Manufacturing Company, Ltd., Hsinchu (TW)

(72) Inventors: Chung-Wei Hsu, Hsinchu (TW); Kuo-Cheng Chiang, Hsinchu County (TW); Mao-Lin Huang, Hsinchu (TW); Lung-Kun Chu, New Taipei (TW); Jia-Ni Yu, Hsinchu (TW); Kuan-Lun Cheng, Hsin-Chu (TW); Chih-Hao Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 62 days.

(21) Appl. No.: 17/167,742

(22) Filed: Feb. 4, 2021

(65) Prior Publication Data
US 2022/0084830 A1 Mar. 17, 2022

Related U.S. Application Data

(60) Provisional application No. 63/077,265, filed on Sep. 11, 2020.

(51) Int. Cl.
H01L 21/28 (2006.01)
H01L 27/092 (2006.01)
(Continued)

(52) U.S. Cl.
CPC .. *H01L 21/28185* (2013.01); *H01L 21/02603* (2013.01); *H01L 21/0332* (2013.01);
(Continued)

(58) Field of Classification Search
CPC ......... H01L 21/28185; H01L 21/02603; H01L 21/0332; H01L 21/28088;
(Continued)

(56) References Cited

U.S. PATENT DOCUMENTS 8,836,016 B2  9/2014  Wu et al.
8,841,701 B2  9/2014  Lin et al.
(Continued)

FOREIGN PATENT DOCUMENTS

CN  111863609 A  10/2020
CN  111863810 A  10/2020
(Continued)

OTHER PUBLICATIONS

Huang, Mao-Lin, et al., "Gate Patterning Process for Multi-Gate Devices", U.S. Appl. No. 16/858,440, filed Apr. 24, 2020, 32 pages of specification and 38 pages of drawings.
(Continued)

Primary Examiner — Tong-Ho Kim
(74) Attorney, Agent, or Firm — Haynes and Boone, LLP

(57) ABSTRACT

A method includes providing a structure having a substrate and a stack of semiconductor layers over a surface of the substrate and spaced vertically one from another; forming an interfacial layer wrapping around each of the semiconductor layers; forming a high-k dielectric layer over the interfacial layer and wrapping around each of the semiconductor layers; and forming a capping layer over the high-k dielectric layer and wrapping around each of the semiconductor layers. With the capping layer wrapping around each of the semiconductor layers, the method further includes performing a thermal treatment to the structure, thereby increasing a thickness of the interfacial layer. After the performing of the thermal treatment, the method further includes removing the capping layer.

20 Claims, 16 Drawing Sheets

(51) Int. Cl.

| | |
|---|---|
| *H01L 29/06* | (2006.01) |
| *H01L 29/423* | (2006.01) |
| *H01L 29/49* | (2006.01) |
| *H01L 29/786* | (2006.01) |
| *H01L 21/02* | (2006.01) |
| *H01L 21/033* | (2006.01) |
| *H01L 21/8238* | (2006.01) |
| *H01L 29/66* | (2006.01) |

(52) U.S. Cl.
CPC ............... *H01L 21/28088* (2013.01); *H01L 21/823821* (2013.01); *H01L 21/823842* (2013.01); *H01L 21/823857* (2013.01); *H01L 27/092* (2013.01); *H01L 29/0673* (2013.01); *H01L 29/42392* (2013.01); *H01L 29/4908* (2013.01); *H01L 29/66742* (2013.01); *H01L 29/78696* (2013.01)

(58) Field of Classification Search
CPC ..... H01L 21/823821; H01L 21/823842; H01L 21/823857; H01L 27/092; H01L 29/0673; H01L 29/42392; H01L 29/4908; H01L 29/66742; H01L 29/78696; H01L 21/823462; H01L 27/088; H01L 29/1079; H01L 29/513; H01L 29/66545; H01L 29/66439; H01L 29/775; H01L 21/823828; H01L 27/0924
USPC .......................................................... 257/351
See application file for complete search history.

(56) References Cited

U.S. PATENT DOCUMENTS

| | | | |
|---|---|---|---|
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 10,763,177 | B1 | 9/2020 | Zhang et al. |
| 2019/0081152 | A1 | 3/2019 | Suh et al. |
| 2019/0103472 | A1 | 4/2019 | Cheng et al. |
| 2019/0348530 | A1* | 11/2019 | Ando ................ H01L 29/42392 |
| 2020/0006155 | A1 | 1/2020 | Chiang et al. |
| 2020/0043808 | A1 | 2/2020 | Bao et al. |
| 2020/0083326 | A1 | 3/2020 | Ok et al. |
| 2020/0168715 | A1* | 5/2020 | Wu ................ H01L 21/823412 |
| 2020/0176581 | A1 | 6/2020 | Lee et al. |
| 2020/0279777 | A1* | 9/2020 | Zhang .................... H01L 27/088 |
| 2021/0202323 | A1* | 7/2021 | Wu ................ H01L 21/823857 |

FOREIGN PATENT DOCUMENTS

| | | |
|---|---|---|
| KR | 20190028061 A | 3/2019 |
| KR | 20190038224 A | 4/2019 |
| KR | 20200003722 A | 1/2020 |
| KR | 20200066569 A | 6/2020 |
| TW | 202020977 A | 6/2020 |
| TW | 202020993 A | 6/2020 |

OTHER PUBLICATIONS

Huang, Wang-Chun, et al., "Semiconductor Devices with Improved Capacitors", U.S. Appl. No. 16/802,396, filed Feb. 26, 2020, 30 pages of specification and 29 pages of drawings.

Chen, Chun-Yuan et al., "Semiconductor Devices with Backside Air Gap Dielectric", U.S. Appl. No. 16/888,217, filed May 29, 2020, Assignee Taiwan Semiconductor Manufacturing Co., Ltd., 26 pages specification, 16 pages drawings.

Su, Huan-Chieh et al., "Backside Power Rail and Methods of Forming the Same", U.S. Appl. No. 16/901,963 filed Jun. 15, 2020, Assignee Taiwan Semiconductor Manufacturing Co., Ltd., 28 pages specification, 22 pages drawings.

Chen, Chun-Yuan et al., "Anchor-Shaped Backside Via and Method Thereof", U.S. Appl. No. 16/926,447, filed Jul. 10, 2020, Assignee Taiwan Semiconductor Manufacturing Co., Ltd., 32 pages specification, 16 pages drawings.

Yu, Jia-Ni, et al., "P-Metal Gate First Gate Replacement Process for Multigate Devices", U.S. Appl. No. 16/834,637, filed Mar. 30, 2020, 43 pages of specification, 24 pages of drawings.

Chu, Lung-Kun et al., "Dipole Patterning for CMOS Devices," U.S. Appl. No. 16/879,613, filed May 20, 2020, 31 pages of specification, 26 pages of drawings.

Chiang, Kuo-Cheng et al., "Semiconductor Devices With Backside Power Rail and Backside Self-Aligned Via," U.S. Appl. No. 17/080,521, filed Oct. 26, 2020, 37 pages of specification, 24 pages of drawings.

* cited by examiner

SEMICONDUCTOR STRUCTURES AND METHODS THEREOF

PRIORITY

This claims the benefits of and priority to U.S. Provisional Application Ser. No. 63/077,265 filed Sep. 11, 2020, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

GAA devices are a promising candidate to take CMOS to the next stage of the roadmap due to their better gate control ability, lower leakage current, and fully FinFET device layout compatibility. A GAA device refers to a device having vertically-stacked horizontally-oriented multi-channel transistors, such as nanowire transistors and nanosheet transistors. However, as the vertical space between channels (or sheets) becomes smaller, making GAA devices has become more and more challenging. One issue in making such small GAA devices is how to fill various layers of high-k metal gates in the space vertically between the channels. Accordingly, although existing semiconductor devices (particularly, multi-gate devices) and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
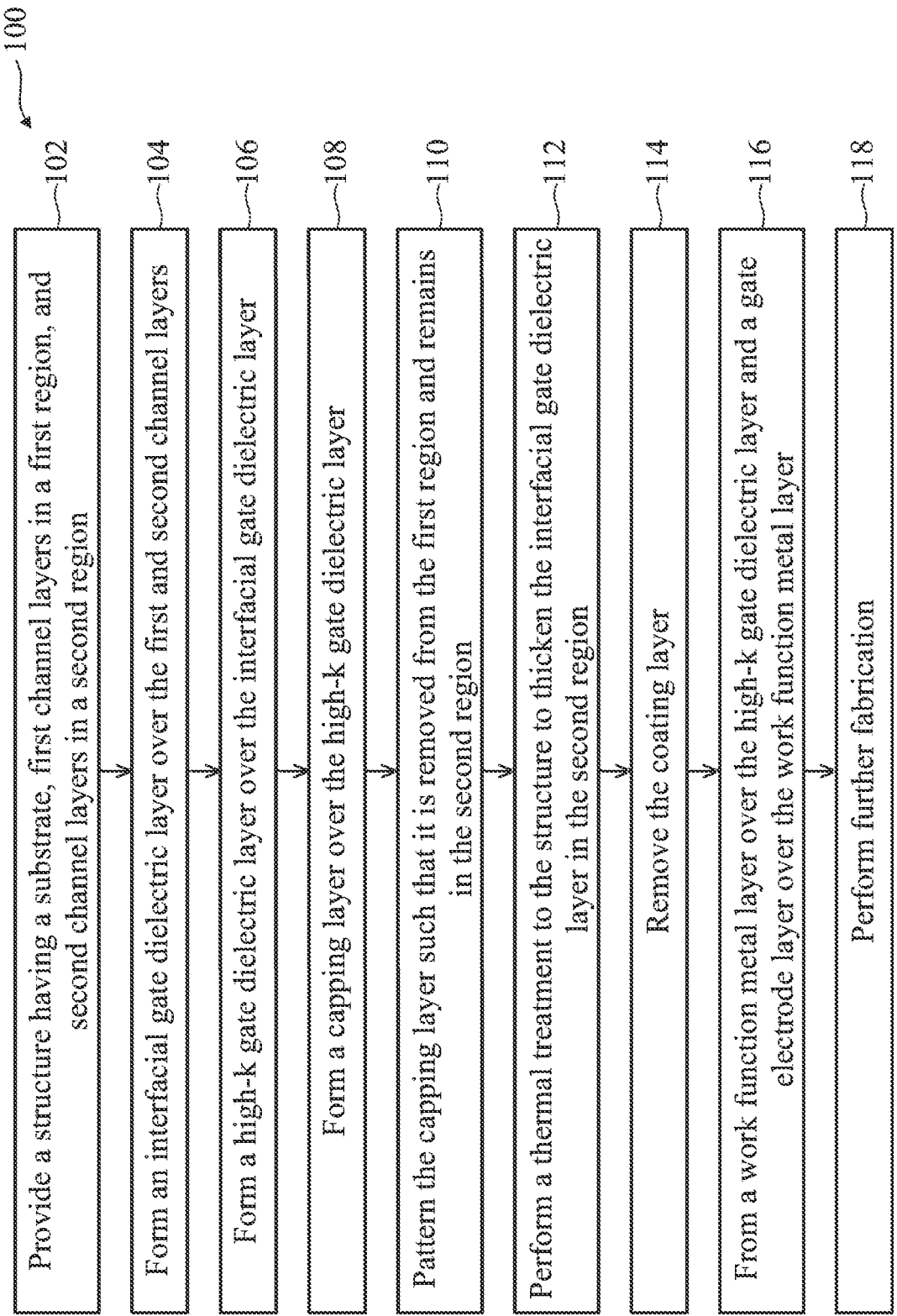
FIGS. 1A and 1B are flow charts of methods for fabricating a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor devices such as integrated circuits (IC), and more particularly, to IC devices having GAA devices (or GAA transistors). A GAA device refers to a transistor having vertically-stacked horizontally-oriented multi-channels, such as a nanowire transistor and a nanosheet transistor. GAA devices are promising candidates to take CMOS to the next stage of the roadmap due to their better gate control ability, lower leakage current, and fully FinFET device layout compatibility. However, as the vertical space between channels (or sheets) becomes smaller, making GAA devices has become more and more challenging. One issue in making such small GAA devices is how to fill various layers of high-k metal gates in the space vertically between the channels. Such layers include an interfacial layer, a high-k gate dielectric layer, and a work function (or workfunction) metal layer for adjusting the threshold voltage of the gate. This issue becomes more important for certain devices (such as transistors providing input/output (IO) functions, electrostatic discharge functions, or high voltage functions) where the interfacial layer is generally thicker than core devices (such as transistors providing core logic functions or memory functions), thus leaving even less room for other layers to be filled in the space between channels.

The present disclosure utilizes an oxygen-scavenging capping layer and a thermal treatment to regrow (or to thicken) the interfacial layer in selected GAA devices (such as IO GAA devices, ESD GAA devices, and high voltage GAA devices). In an embodiment of the present disclosure, after an initial interfacial gate dielectric layer and a high-k gate dielectric layer have been formed around the channels in a semiconductor structure (such as an IC), a capping layer is formed and is patterned. The capping layer is an oxygen-scavenging oxide or an oxygen-scavenging nitride in some embodiments. The capping layer is kept in selected regions (such as in an IO region of the semiconductor structure) where the interfacial gate dielectric layer needs to be thickened and is removed from other regions of the semiconductor structure. Then, a thermal treatment is performed to the semiconductor structure. The interfacial gate dielectric layer in the selected regions becomes thicker due to the presence of the capping layer and the thermal treatment. In some embodiments, the interfacial gate dielectric layer can be thickened by about 2 Å to about 10 Å. The capping layer is subsequently removed, and a work function metal layer is deposited into the space between the channels. The present disclosure provides the following benefits. First, the thickness of the interfacial gate dielectric layers in selected regions can be finely tuned using embodiments of the present disclosure to achieve small GAA transistors. Second, the present methods prevent the channel-to-channel space in GAA devices from being filled up with interfacial gate dielectric layer and high-k gate dielectric layer and keeping enough room for depositing work function metal layer(s). This enables multiple patterning gate (MPG) process to achieve multiple threshold voltages (Vt) in the same integrated circuit, such as standard Vt, lower Vt, higher Vt, etc. The details of the fabrication methods and the structures of the present disclosure are described by referring to the accompanied figures.

Figure 1B:
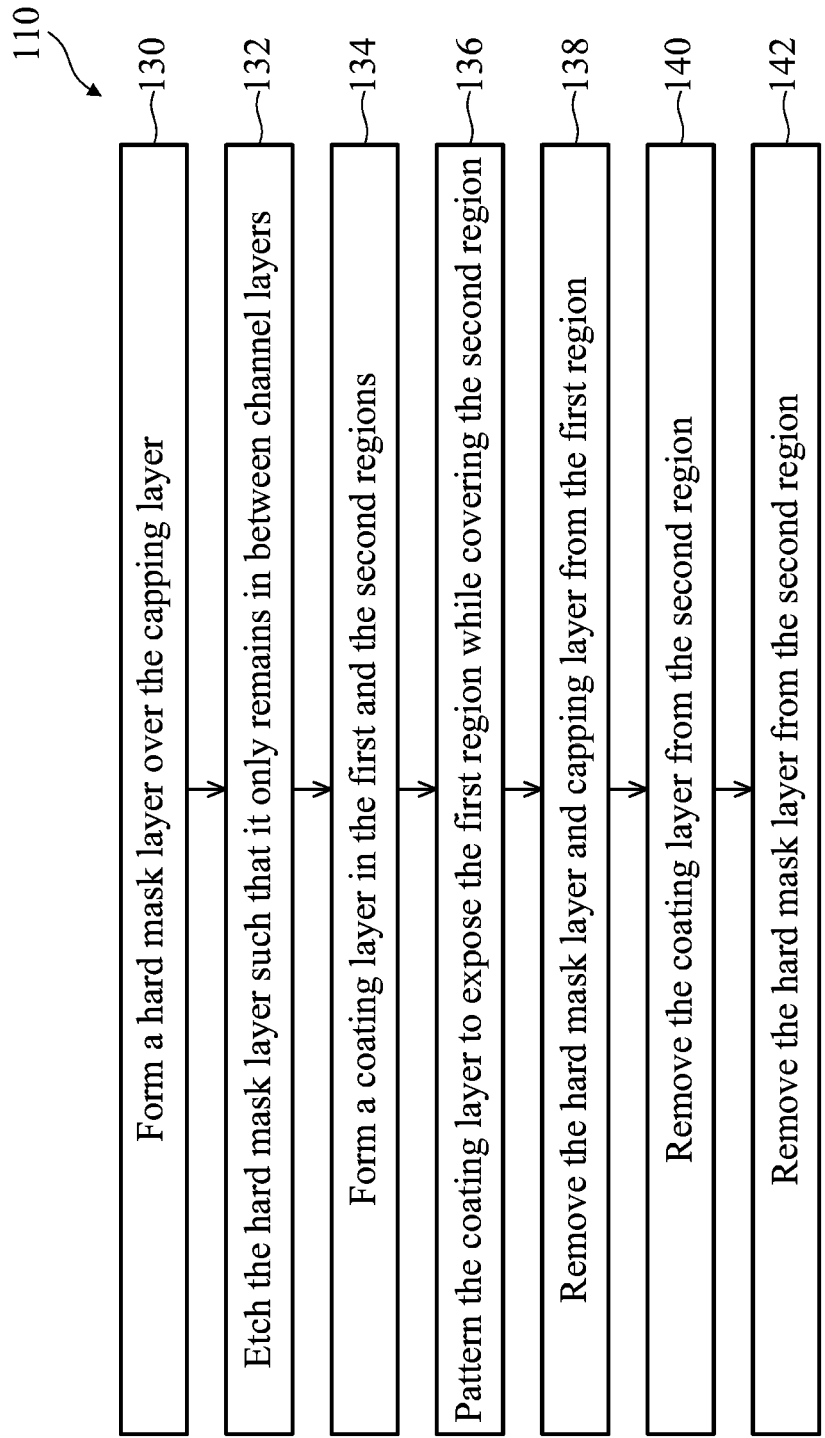
Figure 2A:
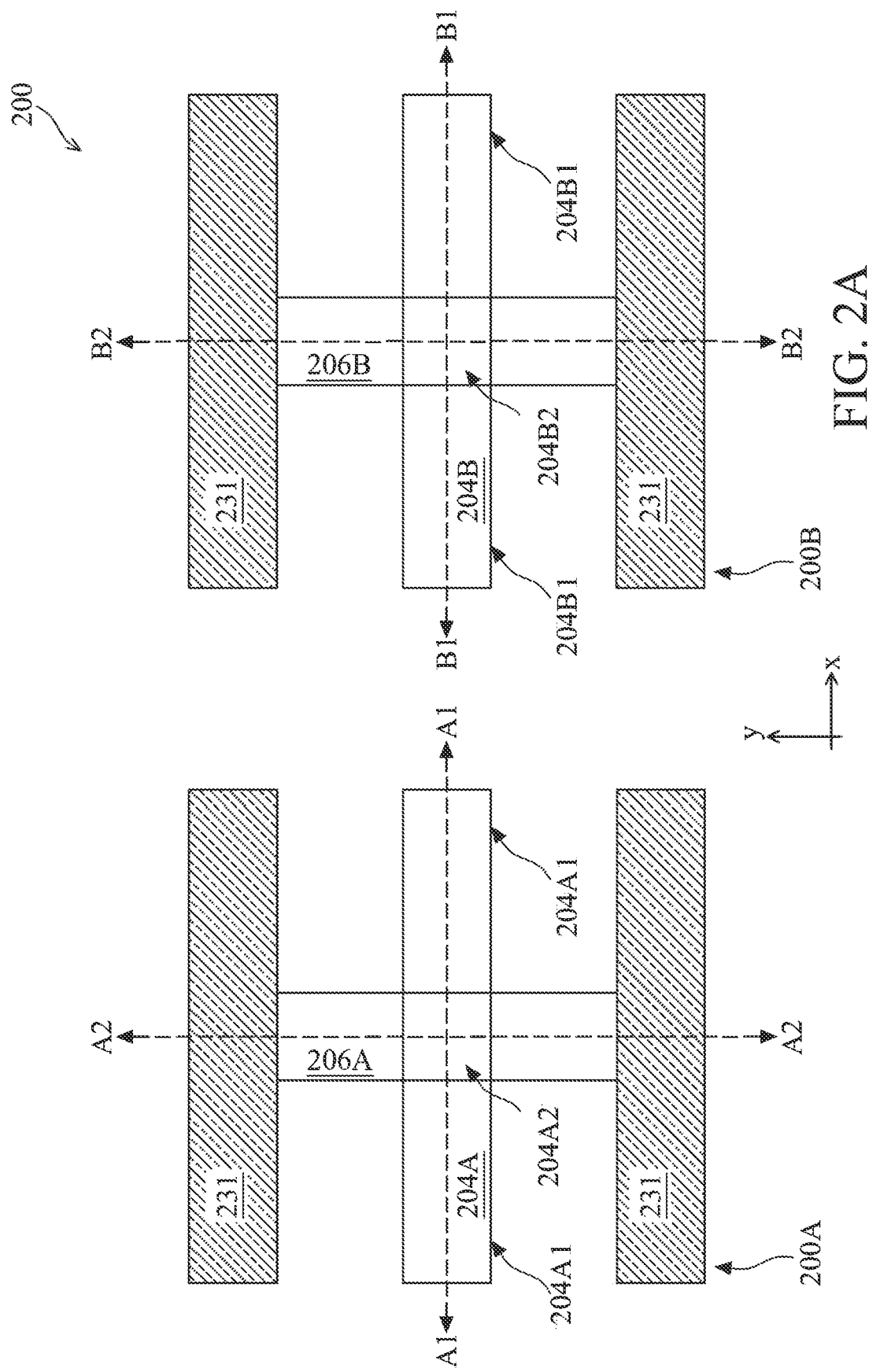
FIG. 2A is a diagrammatic top view of a semiconductor device, in portion, according to various aspects of the present disclosure.

FIGS. 1A and 1B are flow charts of a method 100 for fabricating a semiconductor device according to various aspects of the present disclosure. In some embodiments, the method 100 fabricates a semiconductor device that includes GAA transistors. Additional processing is contemplated by the present disclosure. Additional steps can be provided before, during, and after the method 100, and some of the steps described below can be moved, replaced, or eliminated for additional embodiments of the method 100. The method 100 is described below in conjunction with FIGS. 2A through 14. FIG. 2A is a diagrammatic top view of a semiconductor device 200, in portion, at a fabrication stage associated with method 100 according to various aspects of the present disclosure. FIGS. 2B-14 are diagrammatic cross-sectional views of the device 200, in portion, at various fabrication stage associated with method 100 according to various aspects of the present disclosure.

The device 200 is a multi-gate (or multigate) device in the present embodiments, and may be included in a microprocessor, a memory, and/or other IC devices. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multi-gate device 200 is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof. FIGS. 2A-14 have been simplified for the sake of clarity to better understand the inventive concepts of the present disclosure. Additional features can be added in the device 200, and some of the features described below can be replaced, modified, or eliminated in other embodiments of the device 200. The fabrication of the device 200 is described below in conjunction with embodiments of the method 100.

Figure 2C:
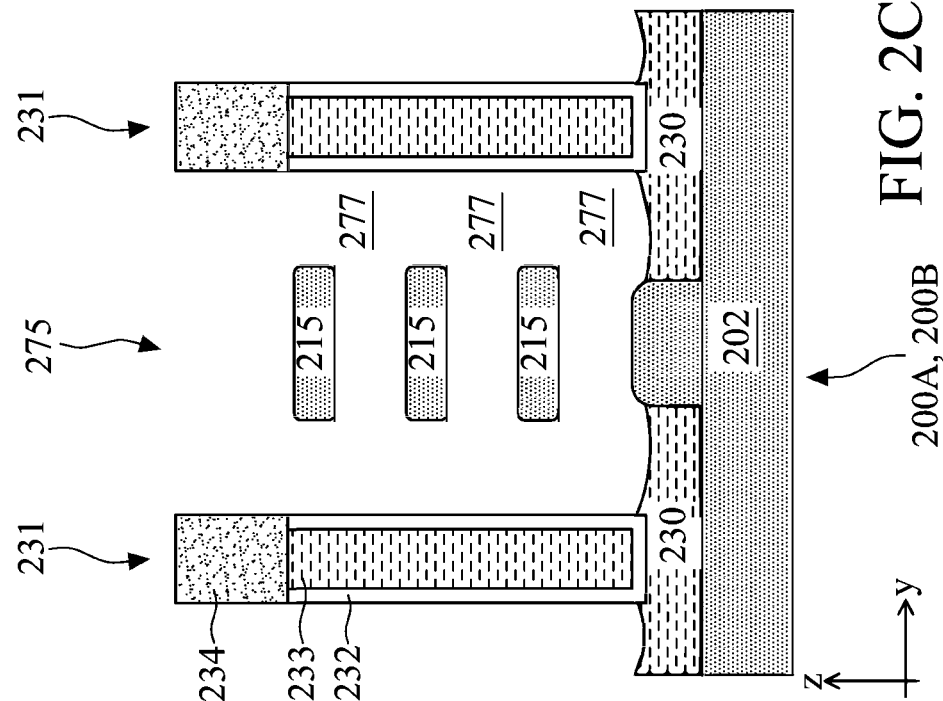
FIGS. 2B and 2C are diagrammatic cross-sectional views of the semiconductor device in FIG. 2A, in portion, according to an embodiment of the present disclosure.
Figure 2B:
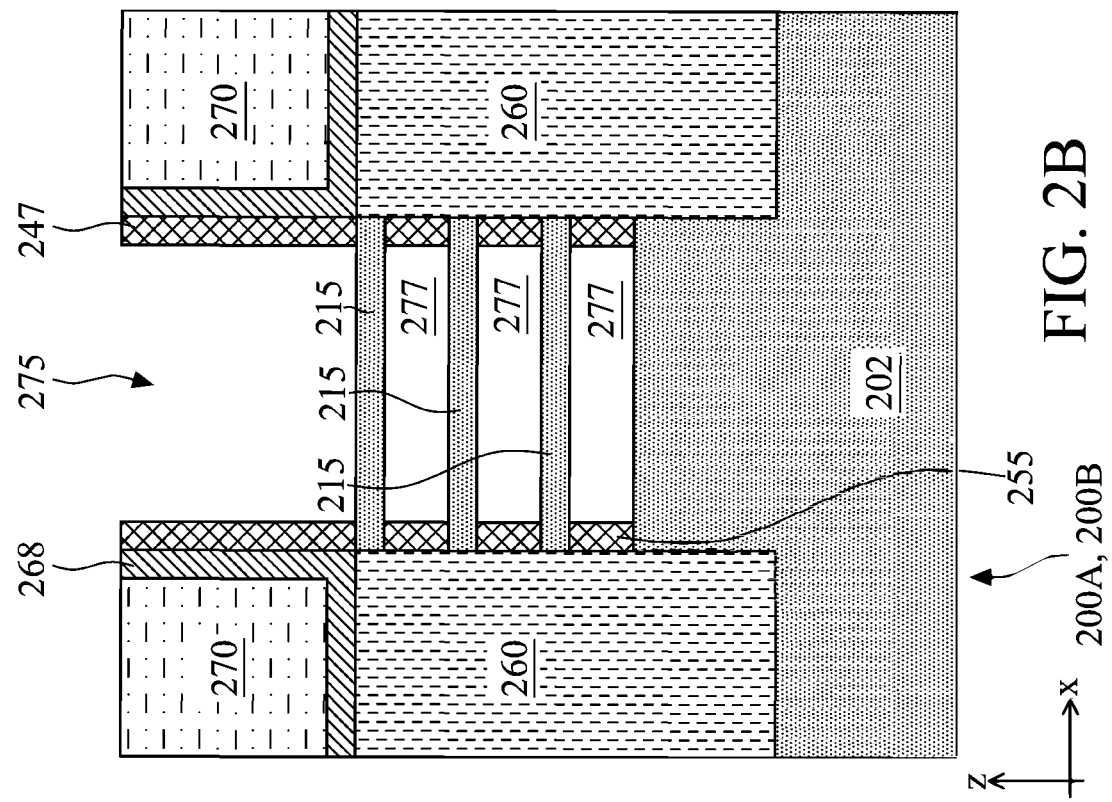

At operation 102, the method 100 (FIG. 1A) provides or is provided with an initial structure of the device 200, a portion of which is shown in FIGS. 2A-2C according to an embodiment. Particularly, FIG. 2A illustrates that the device 200 includes two regions 200A and 200B. The region 200A includes an active region 204A and a gate region 206A generally perpendicular to the active region 204A. The active region 204A includes a pair of source/drain (S/D) regions 204A1 and a channel region 204A2 between the pair of S/D regions. The gate region 206A engages the channel region. The region 200A further includes dielectric fins 231 that are oriented lengthwise generally parallel to the active region 204A and on both sides of the active region 204A. The gate region 206A extends along the "y" direction between the two dielectric fins 231. Similarly, the region 200B includes an active region 204B and a gate region 206B generally perpendicular to the active region 204B. The active region 204B includes a pair of S/D regions 204B1 and a channel region 204B2 between the pair of S/D regions. The gate region 206B engages the channel region. The region 200B further includes dielectric fins 231 that are oriented lengthwise generally parallel to the active region 204B and on both sides of the active region 204B. The gate region 206B extends along the "y" direction between the two dielectric fins 231. In some embodiments, the dielectric fins 231 are omitted in the region 200A, in the region 200B, or in both the regions 200A and 200B.

FIG. 2B illustrates a cross-sectional view of the device 200 according to an embodiment, which is a cross-sectional view of the regions 200A and 200B along the A1-A1 and B1-B1 lines of FIG. 2A, respectively. FIG. 2C illustrates a cross-sectional view of the device 200 according to an embodiment, which is a cross-sectional view of the regions 200A and 200B along the A2-A2 and B2-B2 lines of FIG. 2A, respectively. The embodiments illustrated in FIGS. 2B and 2C are nanosheet FETs, where their channel layers 215 are in the shape of nano-sized sheets. The regions 200A and 200B are illustrated as having the same configuration for the sake of clarity to better understand the inventive concepts of the present disclosure. In various embodiments, the regions 200A and 200B can have different configurations. For example, they may have different number of channels and/or their channel layers 215 can be of different shapes or dimensions. For another example, any of the regions 200A and 200B can be a nanowire FET (i.e., the channel layers 215 are in the shape of nano-sized wires or nano-sized rods) or a nanosheet FET.

Referring to FIGS. 2B-2C, the device 200 includes a substrate (such as a wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-oninsulator (SOI) substrate, a silicon germanium-on-insulator (SGOI) substrate, or a germanium-on-insulator (GOI) substrate.

Each of the regions 200A and 200B further includes a pair of S/D features 260. For n-type transistors, the S/D features 260 are of n-type. For p-type transistors, the S/D features 260 are of p-type. The S/D features 260 may be formed by epitaxially growing semiconductor material(s) (e.g., Si, SiGe) to fill trenches in the device 200, for example, using CVD deposition techniques (e.g., Vapor Phase Epitaxy), molecular beam epitaxy, other suitable epitaxial growth processes, or combinations thereof. The S/D features 260 are doped with proper n-type dopants and/or p-type dopants. For example, for n-type transistors, the S/D features 260 may include silicon and be doped with carbon, phosphorous, arsenic, other n-type dopant, or combinations thereof; and for p-type transistors, the S/D features 260 may include silicon germanium or germanium and be doped with boron, other p-type dopant, or combinations thereof.

Each of the regions 200A and 200B further includes a stack of semiconductor layers 215 suspended over the substrate 202 and connecting the pair of the S/D features 260. The stack of semiconductor layers 215 serve as the transistor channels for the respective transistors. Accordingly, the semiconductor layers 215 are also referred to as channel layers 215. The channel layers 215 are exposed in a gate trench 275 which is resulted from the removal of a dummy gate from the respective gate region 206A and 206B (FIG. 2A) therein. The channel layers 215 may include single crystalline silicon. Alternatively, the channel layers 215 may include germanium, silicon germanium, or another suitable semiconductor material(s). Initially, the channel layers 215 are formed as part of a semiconductor layer stack that includes the channel layers 215 and other semiconductor layers of a different material. The semiconductor layer stack is patterned into a shape of a fin protruding above the substrate 202 using one or more photolithography processes, including double-patterning or multi-patterning processes. After the gate trenches 275 are formed, the semiconductor layer stack is selectively etched to remove the other semiconductor layers, leaving the channel layers 215 suspended over the substrate 202 and between the respective S/D features 260. The channel layers 215 are separated from each other and from the substrate 202 by gaps 277.

In some embodiments, each channel layer 215 has nanometer-sized dimensions, thus may be referred to as nanostructures. For example, each channel layer 215 may have a length (along the "x" direction) about 10 nm to about 300 nm, and a width (along the "y" direction) about 10 nm to about 80 nm, and a height (along the "z" direction) about 4 nm to about 8 nm in some embodiments. The vertical spacing 277 (along the "z" direction) between the channel layers 215 may be about 6 nm to about 12 nm in some embodiments. Thus, the channel layer 215 can be referred to as a "nanowire" or "nanosheet" which generally refers to a channel layer suspended in a manner that will allow a high-k metal gate to physically wrap around the channel layer. In some embodiments, the channel layers 215 may be cylindrical-shaped (e.g., nanowire), rectangular-shaped (e.g., nanobar), sheet-shaped (e.g., nanosheet), or have other suitable shapes.

The device 200 further includes isolation feature(s) 230 to isolate various regions, such as the various active regions 204A and 204B. Isolation features 230 include silicon oxide, silicon nitride, silicon oxynitride, other suitable isolation material (for example, including silicon, oxygen, nitrogen, carbon, or other suitable isolation constituent), or combinations thereof. Isolation features 230 can include different structures, such as shallow trench isolation (STI) structures, deep trench isolation (DTI) structures, and/or local oxidation of silicon (LOCOS) structures. Isolation features 230 can include multiple layers of insulating materials.

The device 200 further includes gate spacers 247 adjacent to the S/D features 260. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The device 200 further includes inner spacers 255 vertically between adjacent channel layers 215 and adjacent to the S/D features 260. Inner spacers 255 may include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 255 include a low-k dielectric material. The gate spacers 247 and the inner spacers 255 are formed by deposition (e.g., CVD, PVD, ALD, etc.) and etching processes (e.g., dry etching). The gate trenches 275 are provided between opposing gate spacers 247 and opposing inner spacers 255 along the "x" direction.

The device 200 further includes a contact etch stop layer (CESL) 268 disposed over the isolation features 230, the epitaxial S/D features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-level dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

The dielectric fins 231 are disposed over the isolation features 230. In the embodiment depicted in FIG. 2C, the dielectric fins 231 include a dielectric liner 232, a dielectric fill layer 233 over the dielectric liner 232, and a dielectric helmet 234 over the dielectric layers 232 and 233. In an embodiment, the dielectric liner 232 includes a low-k dielectric material such as a dielectric material including Si, O, N, and C. Exemplary low-k dielectric materials include FSG, carbon doped silicon oxide, Xerogel, Aerogel, amorphous fluorinated carbon, Parylene, BCB, polyimide, or combinations thereof. Low-k dielectric material generally refers to dielectric materials having a low dielectric constant, for example, lower than that of silicon oxide (k≈3.9). The dielectric liner 232 may be deposited using CVD, PVD, ALD, HDPCVD, MOCVD, RPCVD, PECVD, LPCVD, ALCVD, APCVD, other suitable methods, or combinations thereof. In an embodiment, the dielectric fill layer 233 includes silicon oxide, silicon nitride, silicon oxynitride, TEOS formed oxide, PSG, BPSG, low-k dielectric material, other suitable dielectric material, or combinations thereof. The dielectric fill layer 233 may be deposited using a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The dielectric fill layer 233 may be deposited using other types of methods. In an embodiment, the dielectric helmet 234 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The dielectric helmet 234 is formed by any of the processes described herein, such as ALD, CVD, PVD, oxidation-based deposition process, other suitable process, or combinations thereof. The gate trenches 275 are provided between opposing dielectric fins 231 along the "y" direction.

Figure 3:
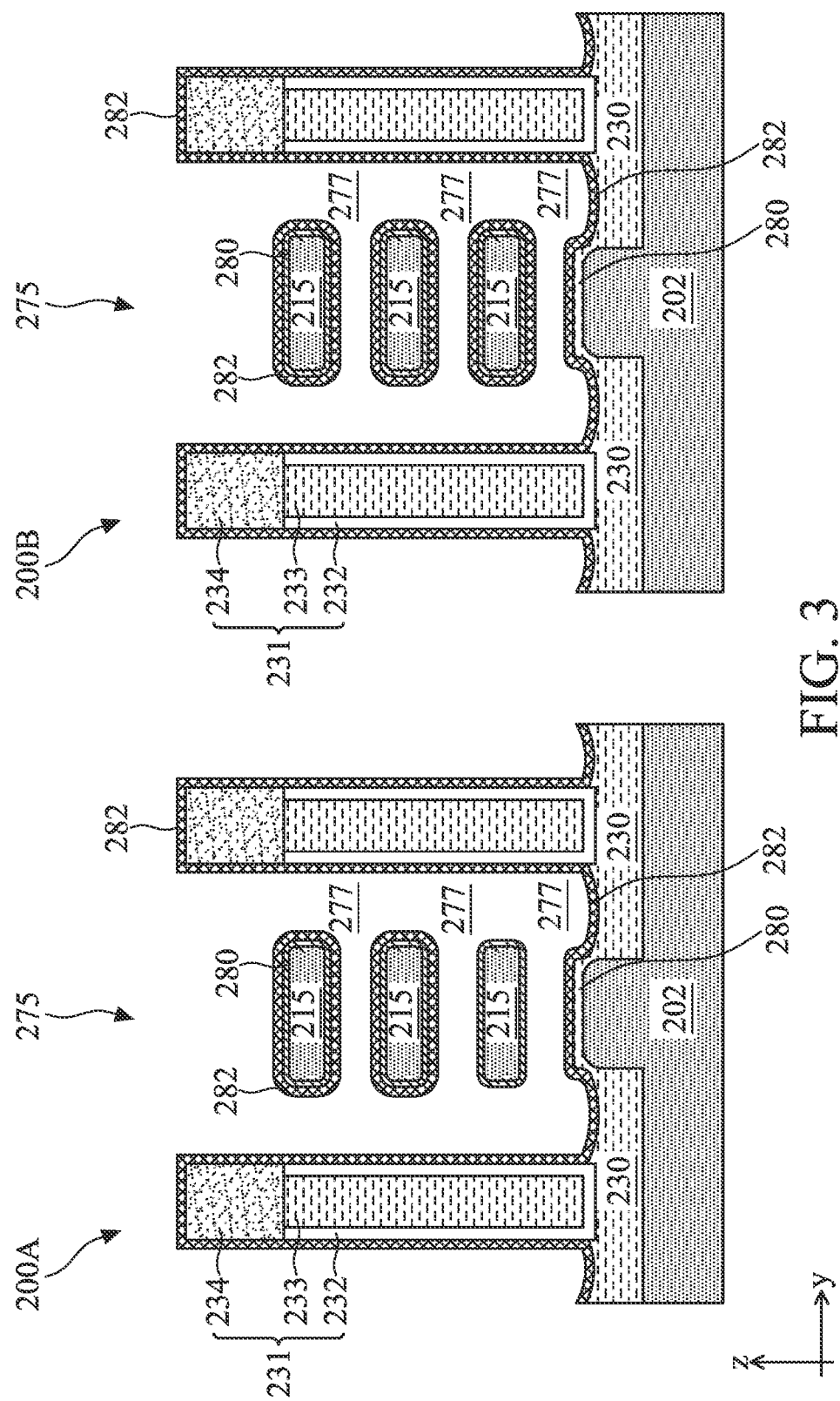
FIGS. 3, 4, 5, 6, 7, 8, 9, 10, 11, 12, 13, and 14 are diagrammatic cross-sectional views of the semiconductor device in FIG. 2A, in portion, at various fabrication stages (such as those associated with the method in FIGS. 1A and 1B) according to various aspects of the present disclosure.

At the operation 104, the method 100 (FIG. 1A) forms an interfacial gate dielectric layer (or simply, interfacial layer) 280 on the surfaces of the channel layers 215 that are exposed in the gate trenches 275, such as shown in FIG. 3. FIGS. 3 through 14 illustrate cross-sectional views of the region 200A and 200B along the A2-A2 line and the B2-B2 line of FIG. 2A, respectively. Turning to FIG. 3, in the depicted embodiment, the interfacial layer 280 wraps around each of the channel layers 215 and partially fills the gaps 277. In the present embodiment, the interfacial layer 280 is disposed on the semiconductor surfaces exposed in the gate trench 275 such as the surfaces of the channel layers 215 and the substrate 202, but not on the dielectric surfaces exposed in the gate trench 275 such as the surfaces of the isolation features 230, the gate spacers 247, and the dielectric fins 231. For example, the interfacial layer 280 may be formed by an oxidation process (such as thermal oxidation or chemical oxidation) where the semiconductor surfaces react with oxygen to form a semiconductor oxide as the interfacial layer 280. In such oxidation process, the dielectric surfaces do not react with the oxygen, thus, the interfacial layer 280 is not formed thereon. In an alternative embodiment, the interfacial layer 280 is disposed not only on the channel layers 215 and the substrate 202, but also on the isolation features 230, the gate spacers 247, and the dielectric fins 231, for example, by using atomic layer deposition (ALD) or other suitable deposition methods. The interfacial layer 280 includes a dielectric material, such as $SiO_2$, HfSiO, SiON, other silicon-containing dielectric material, other suitable dielectric material, or combinations thereof. In some embodiments, the interfacial layer 280 has a thickness of about 5 Å to about 15 Å. If the interfacial layer 280 is too thin (such as less than 5 Å), its reliability might be poor in some cases. If the interfacial layer 280 is too thick (such as more than 15 Å), the remaining portion of the gaps 277 might be too small to have a high-k dielectric layer and a work function metal layer to fill therein in some cases.

At the operation 106, the method 100 (FIG. 1A) forms a high-k gate dielectric layer (or simply, high-k dielectric layer) 282 over the interfacial layer 280 and over other structures exposed in the gate trench 275, such as shown in FIG. 3. Turning to FIG. 3, the high-k dielectric layer 282 is disposed over the interfacial layer 280 and wraps around each of the channel layers 215. The high-k dielectric layer 282 and the interfacial layer 280 collectively partially fill the gaps 277. In the present embodiment, the high-k dielectric layer 282 is also disposed on the isolation features 230, the gate spacers 247, and the dielectric fins 231. For example, the high-k dielectric layer 282 is disposed directly on the isolation features 230, the gate spacers 247, and the dielectric fins 231 in an embodiment. The high-k dielectric layer 282 includes a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof. The high-k dielectric layer 282 is formed by any of the processes described herein, such as ALD, CVD, PVD, oxidation-based deposition process, other suitable process, or combinations thereof. In some embodiments, the high-k dielectric layer 282 has a thickness of about 1 nm to about 2 nm.

Figure 4:
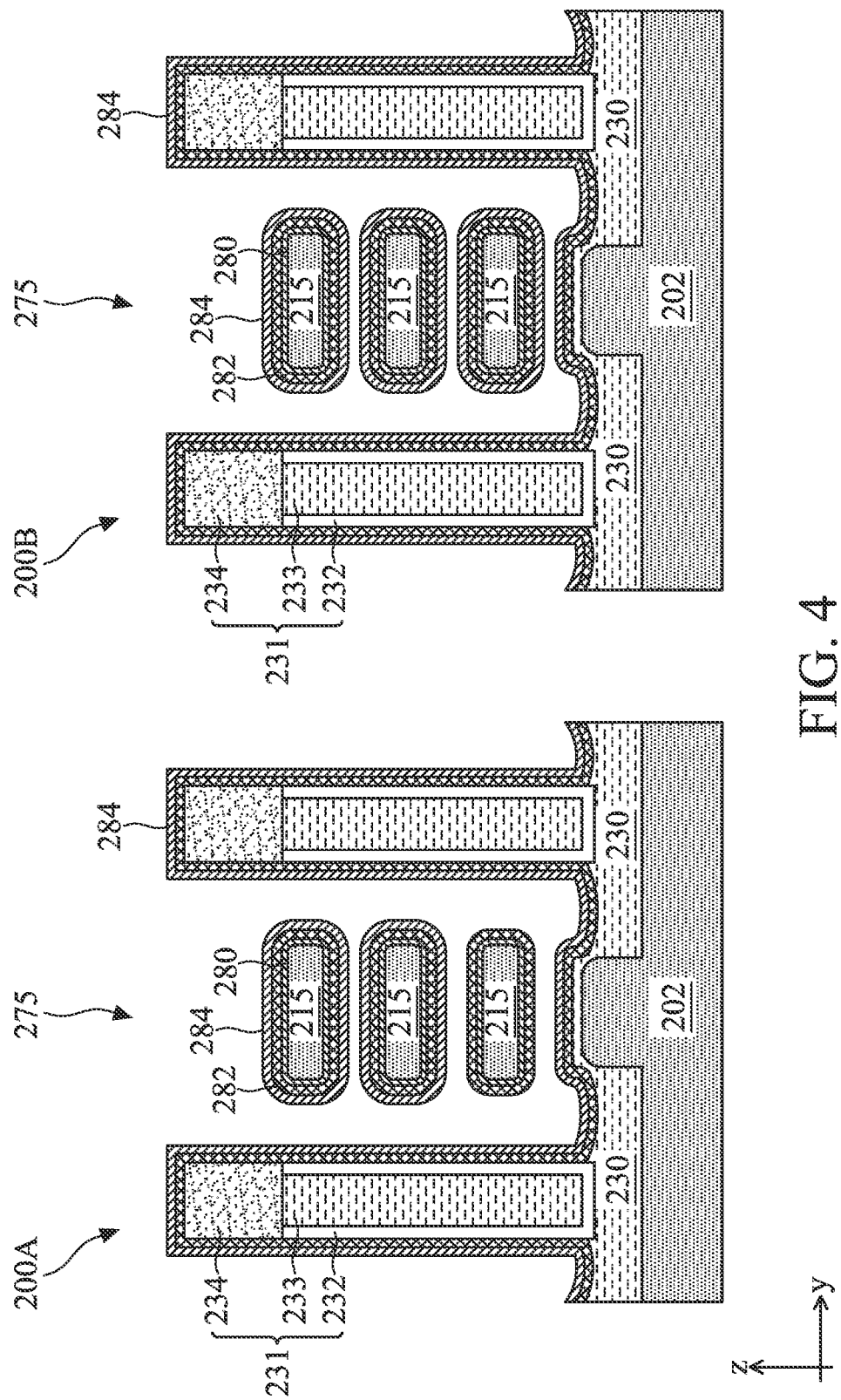

At operation 108, the method 100 (FIG. 1A) forms a capping layer 284 over the high-k dielectric layer 282 in the regions 200A and 200B, such as shown in FIG. 4 according to an embodiment. Turning to FIG. 4, in both the regions 200A and 200B, the capping layer 284 is deposited over the high-k dielectric layer 282 and wrapping around each of the channel layers 215. The capping layer 284 is also deposited over isolation features 230 and the dielectric fins 231. The capping layer 284, the high-k dielectric layer 282, and the interfacial layer 280 collectively only partially fill the gaps 277 between adjacent channel layers 215 in the present embodiment. This helps to more uniformly increase the thickness of the interfacial layer 280 during a subsequent thermal treatment. In the present embodiment, the capping layer 284 includes one or more oxygen-scavenging materials. In other words, the capping layer 284 includes one or more materials that attract ambient oxygen ($O_2$) (oxygen in the environment surrounding the device 200). For example, the capping layer 284 includes an oxygen-scavenging oxide, an oxygen-scavenging nitride, or other oxygen-scavenging materials. Further, the one or more oxygen-scavenging materials have etching selectivity with respect to the materials in the high-k dielectric layer 282. In other words, the capping layer 284 can be removed by an etching process that has little to no etching to the high-k dielectric layer 282 in a subsequent step. In an embodiment, the capping layer 284 includes TiN, TiSiN, $TiO_2$, TiON, TaN, TaSiN, $TaO_2$, TaON, or a combination thereof. As will be discussed, embodiments of the present disclosure utilize the oxygen-scavenging property of the capping layer 284 to increase the thickness of the interfacial layer 280 in selected device regions, such as the region 200B. Using such methods can maintain sufficient spacing between the high-k dielectric layer 282 on the adjacent channel layers 215 while obtaining sufficiently thick interfacial layer 280 for certain transistors, such as IO transistors, ESD transistors, and high voltage transistors. In some embodiments, the capping layer 284 may be deposited using ALD, CVD, a thermal process (such as furnace process), a PVD process, or other suitable processes and may be deposited at a temperate in a range of about 100° C. to about 400° C. and pressure in a range of about 1 torr to 100 torr. In some embodiments, the capping layer 284 has a thickness in a range of about 5 Å to 50 Å. If the capping layer 284 is too thin (such as less than 5 Å), its uniformity and effectiveness as the oxygen-scavenger might be poor in some cases. If capping layer 284 is too thick (such as more than 50 Å), the capping layer 284 on the dielectric fins 231 and on the channel layers 215 might merge, causing issues in subsequent steps, such as non-uniform thickness increasing in the interfacial layer 280.

At operation 110, the method 100 (FIG. 1A) patterns the capping layer 284 so that it is kept in regions where the interfacial layer 280 is going to be thickened and it is removed from other regions. For example, the capping layer 284 is kept in the region 200B and is removed from the region 200A in the present embodiment. This may involve a variety of processes including deposition, photolithography, and etching. The capping layer 284 may be patterned using any suitable methods. FIG. 1B illustrates a flow chart of the operation 110 according to an embodiment. Different processing is contemplated by the present disclosure. Some of the steps described in FIG. 1B can be moved, replaced, or eliminated for additional embodiments of the operation 110.

Figure 5:
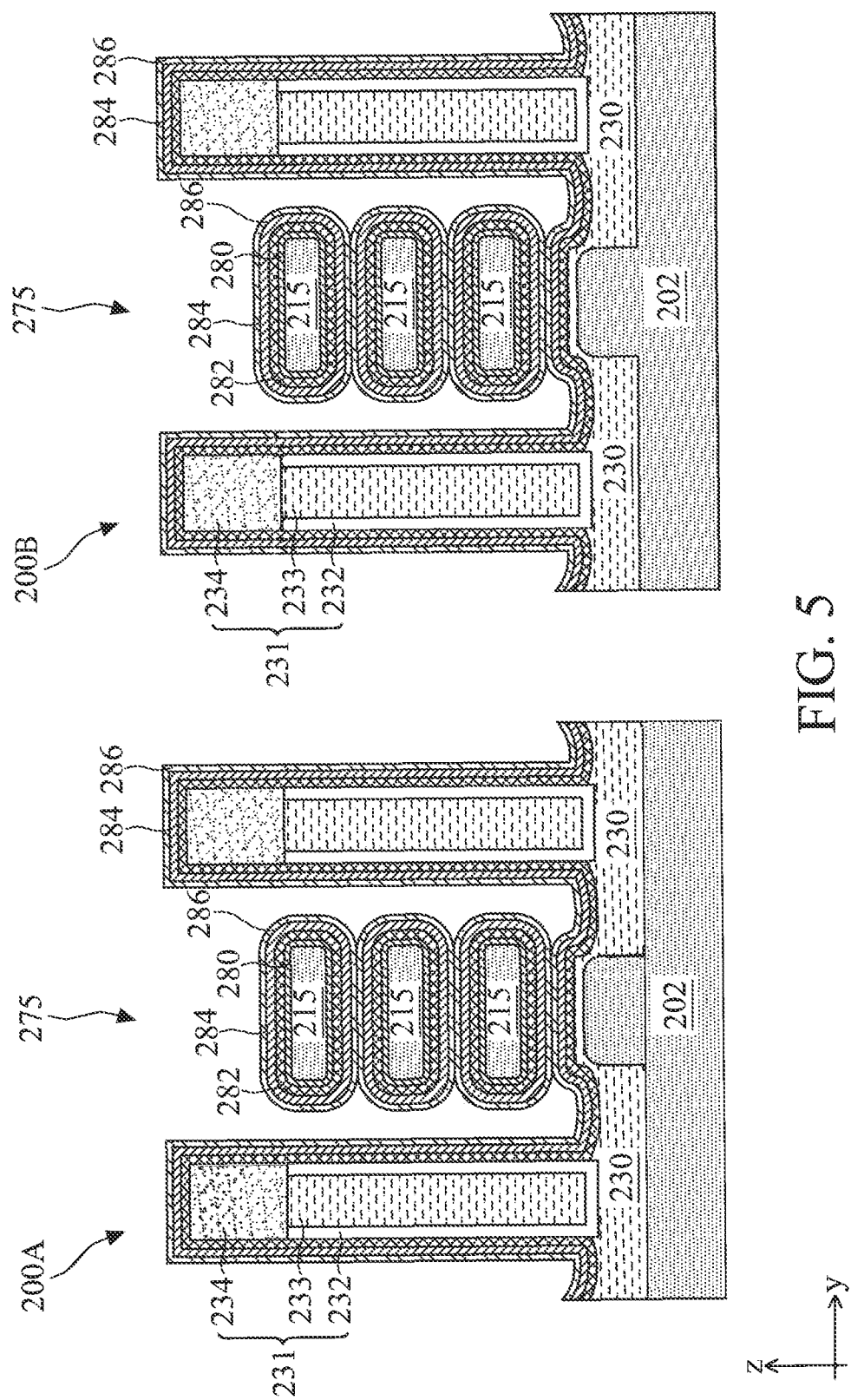

Referring to FIG. 1B, at step 130, the operation 110 forms a hard mask (HM) layer 286 (also referred to as a sacrificial layer 286) over the capping layer 284 such as shown in FIG. 5 according to an embodiment. Referring to FIG. 5, in the depicted embodiment, the HM layer 286 partially fills the gate trenches 275 and wraps around channel layers 215 in both the device regions 200A and 200B. The HM layer 286 is also deposited over the dielectric fins 231 and the over the isolation features 230. The HM layer 286 may be deposited by any of the processes described herein, such as ALD, CVD, PVD, other suitable process, or combinations thereof. A thickness of the HM layer 286 is configured to fill any remaining portion of the gaps 277 between the adjacent channel layers 215 in the device regions 200A and 200B without filling the gate trenches 275. As will be discussed, if the HM layer 286 does not fill the remaining portion of the gaps 277 between the adjacent channel layers 215, it would be difficult to pattern a later-deposited coating layer. In some embodiments, the thickness of the HM layer 286 is about 5 Å to about 50 Å. If the HM layer 286 is too thin (such as less than 5 Å), its uniformity and effectiveness as a hard mask in subsequent steps might be poor in some cases or it might not be able to fully fill the remaining portion of the gaps 277 between the adjacent channel layers 215. If the HM layer 286 is too thick (such as more than 50 Å), the HM layer 286 on the dielectric fins 231 and on the channel layers 215 might merge, causing issues in subsequent steps (for example, it might prevent a coating layer to be properly deposited and patterned).

The HM layer 286 includes a material that achieves high etching selectivity between the HM layer 286 and the capping layer 284 during an etching process. For example, the HM layer 286 can be selectively etched with minimal (to no) etching of the capping layer 284 in an etching process, which can be a dry etching process or a wet etching process. In some embodiments, the etching selectivity is 100:1 or more. In other words, the etching process etches the HM layer 286 at a rate that is at least 100 times greater than a rate at which it etches the capping layer 284. In some embodiments, the HM layer 286 includes alumina, silicon nitride, lanthanum oxide, silicon (such as polysilicon), silicon carbonitride, silicon oxy carbonitride, aluminum nitride, aluminum oxynitride, a combination thereof, or other suitable materials. In some embodiments, the HM layer 286 may be deposited using ALD, CVD, a thermal process (such as a furnace process), a PVD process, or other suitable processes, and may be deposited at a temperate in a range of about 100° C. to about 400° C. and pressure in a range of about 1 torr to 100 torr.

Figure 6:
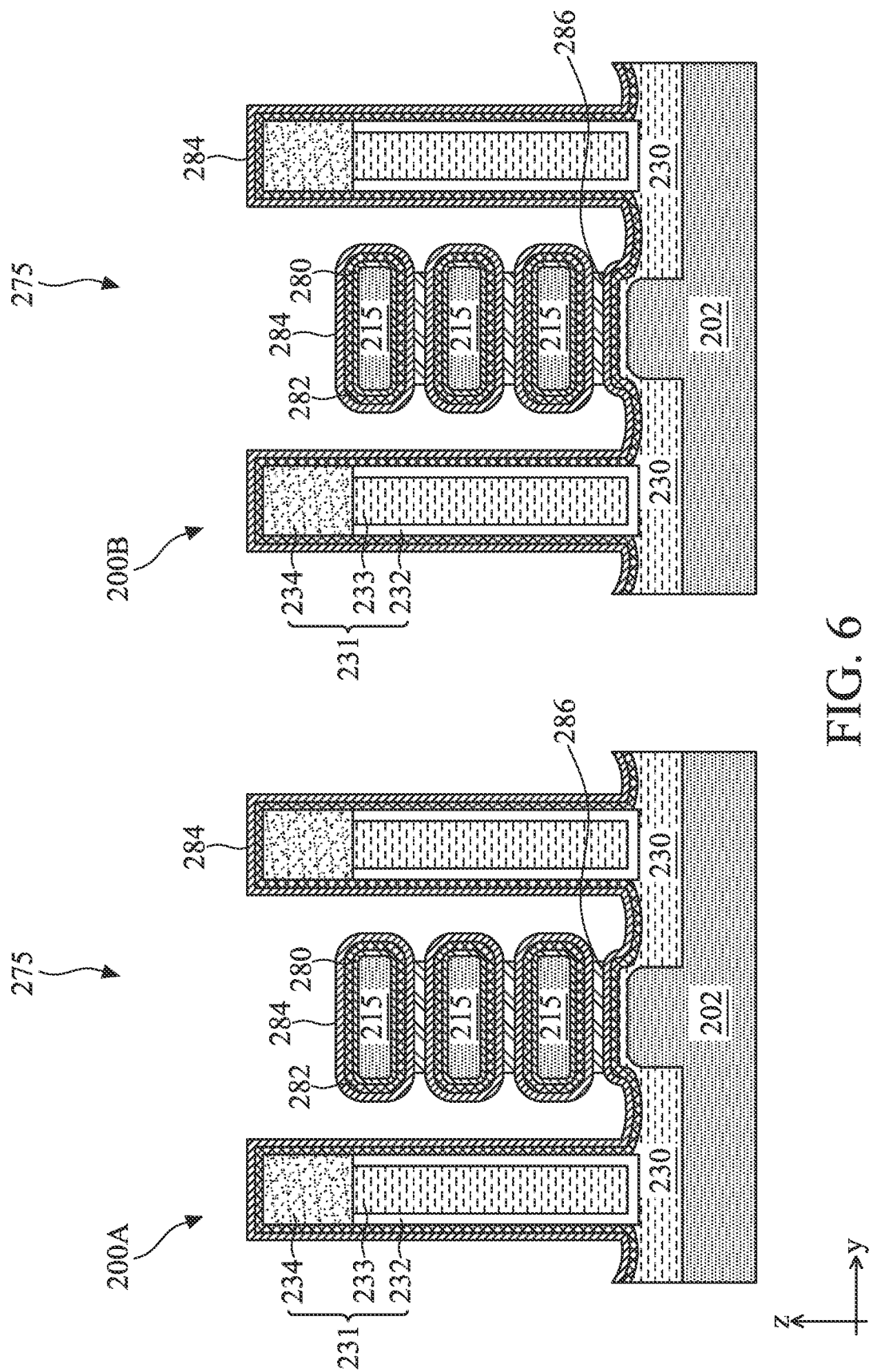

At step 132, the operation 110 (FIG. 1B) etches the HM layer 286 such that it only remains in the gaps 277 (i.e., in the space vertically between different portions of the capping layers 284 on the channel layers 215) and it is removed from everywhere else, such as shown in FIG. 6 according to an embodiment. Turning to FIG. 6, the HM layer 286 is partially removed and the remaining portions of the HM layer 286 fill the space between portions of the capping layer 284 on the channel layers 215 and on the substrate 202 in both the device regions 200A and 200B. For the sake of convenience, the remaining portions of the HM layer 286 are sometimes referred to as sacrificial (HM) plugs 286. In some embodiments, the etching process is a wet etching process or a dry etching process that uses etchants having a high etching selectivity with respect to the HM layer 286 relative to the capping layer 284. In some embodiments, the etchants exhibit an etching selectivity (i.e., a ratio of an etch rate of the HM layer 286 to an etch rate of the capping layer 284 in the etching solution) of about 100 or more. In some embodiments, the step 132 uses a wet etching process that implements an $NH_4OH$-based wet etching solution. In some embodiments, the step 132 uses a wet etching process that implements an SC-1-based wet etching solution, where the SC-1 solution includes de-ionized water, ammonia, and hydrogen peroxide at a suitable ratio to achieve the etch selectivity discussed above. In some embodiments, the step 132 uses a dry etching process that uses fluorine-based etching gases, chlorine-based etching gases, bromine-based etching gases, or other suitable etching gases. For example, the dry etching process may use $NF_3$, $BCl_3$, HBr, or other suitable etching gases. Parameters of the etching process (such as etching temperature, etching solution concentration, etching gas flow rate, etching time, other suitable etching parameters, or combinations thereof) are controlled to remove the HM layer 286 from the topmost portion of the capping layer 284, from the sidewalls of channel layers 215, from the dielectric fins 231, and from the isolation features 230, with minimal (to no) etching of the capping layer 284.

Figure 7:
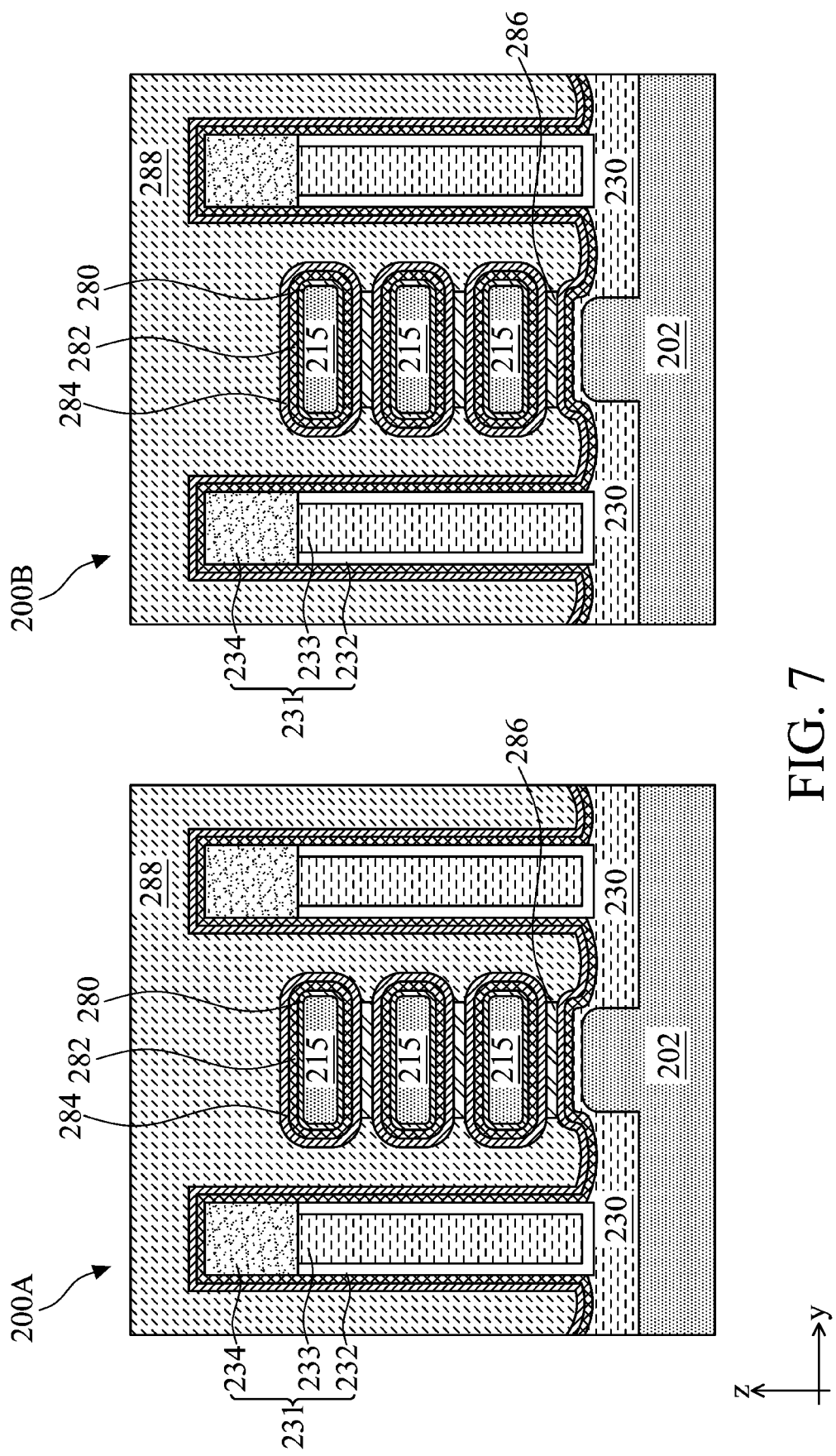

At step 134, the operation 110 (FIG. 1B) forms a coating layer 288 over the device 200, including in the regions 200A and 200B, such as shown in FIG. 7 according to an embodiment. For example, the coating layer 288 may include a bottom anti-reflective coating (BARC) material that provides a platform for photoresist coating and photoresist patterning. In an embodiment, the coating layer 288 is formed by spin coating a BARC material over the device 200 and filling the gate trenches 275, and baking the BARC material (for example, at a temperature in a range about 100° C. to about 200° C.) to cause cross-linking within the BARC material. Because the HM features 286 fill the space vertically between the channel layers 215 and between the bottommost channel layer 215 and the substrate 202, the coating layer 288 is not formed in those space.

Figure 8:
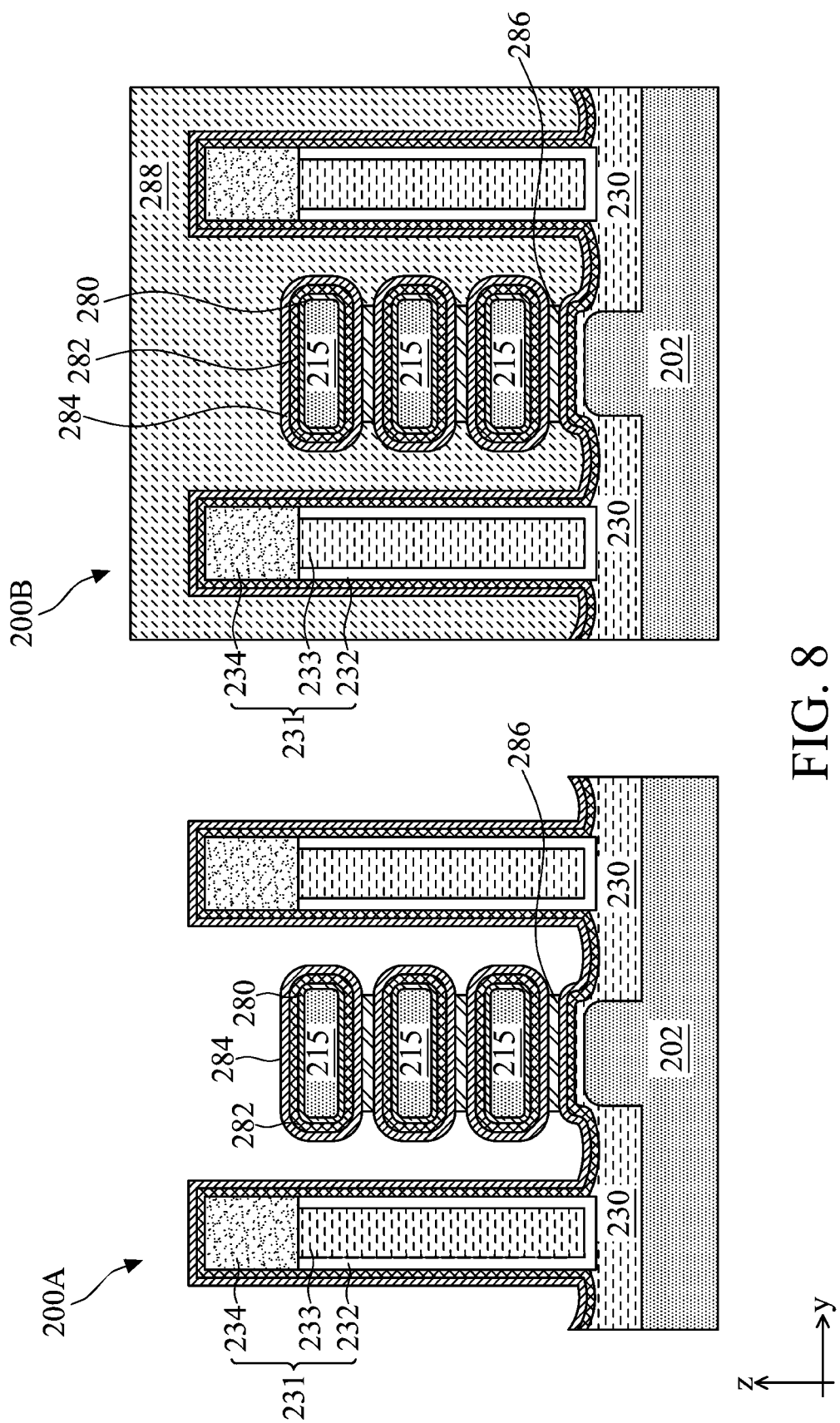

At step 136, the operation 110 (FIG. 1B) patterns the coating layer 288 so that it is removed from the region 200A and is kept in 200B, such as shown in FIG. 8 according to an embodiment. This results in a patterned coating layer 288. In an embodiment, the operation 110 applies a lithography process that includes forming a resist (or photoresist) layer over the device 200 by spin coating, performing a pre-exposure baking process, performing an exposure process, performing a post-exposure baking process, and developing the exposed resist layer in a developer solution. After the development, the resist layer becomes a resist pattern that corresponds with the photomask, where the resist pattern covers the device region 200B and exposes the device region 200A. The exposure process can be implemented using a photomask or using a maskless lithography process such as e-beam writing, ion-beam writing, or combinations thereof. Using the resist pattern as an etch mask, the operation 110 etches the coating layer 288 and removes it from the device region 200A. In an embodiment, the etching of the coating layer 288 implements an anisotropic etching process so that the remaining portion of the coating layer 288 over the region 200B can be better preserved and the boundary between the regions 200A and 200B can be more finely controlled. This beneficially improves the resolution of the operation 110. As shown in FIG. 8, after the coating layer 288 is removed from the region 200A, the capping layer 284 and the HM layer 286 are exposed in the region 200A.

Figure 9:
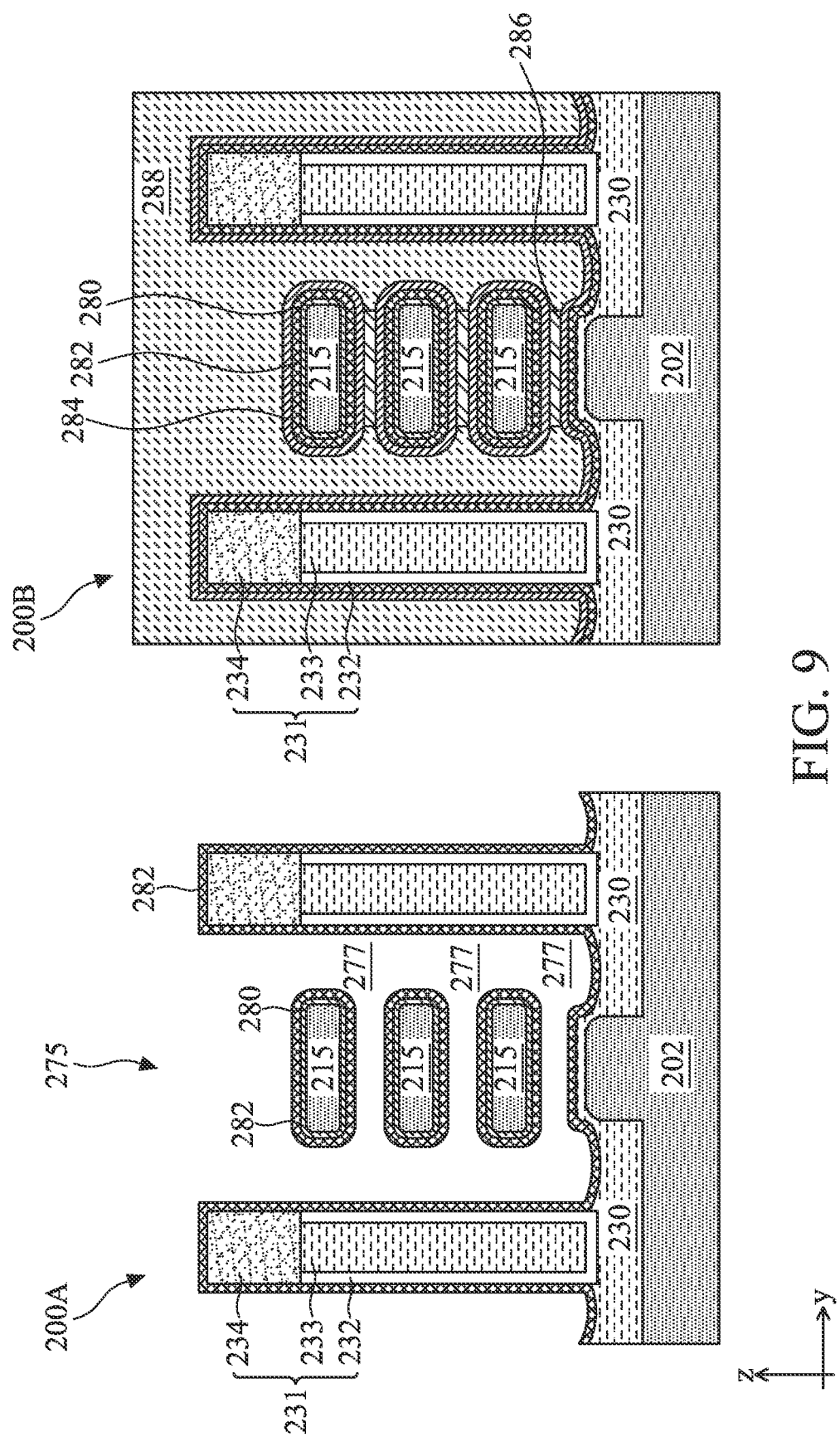

At step 138, the operation 110 (FIG. 1B) etches the capping layer 284 and the HM layer 286 using the patterned coating layer 288 and any remaining portion of the resist pattern as an etch mask, thereby removing the capping layer 284 and the HM layer 286 from the region 200A. The resultant structure is shown in FIG. 9 according to an embodiment. The region 200B is protected by the coating layer 288 from the etching process. The etching process completely removes the HM layer 286 and the capping layer 284 from the region 200A, thereby exposing the high-k dielectric layer 282 in the region 200A. The etching process essentially re-claims or re-forms a portion of gaps 277 in the region 200A. In an embodiment, the operation 110 applies two etching processes with one etching process removing the HM layer 286 and another etching process removing the capping layer 284. In another embodiment, the operation 110 applies one etching process that removes both the HM layer 286 and the capping layer 284. The etching process(es) of the step 138 provides a high etching selectivity with respect to the HM layer 286 and the capping layer 284 relative to the high-k dielectric layer 282. In some embodiments, the etching process(es) exhibits an etching selectivity of about 10 to about 100. In some embodiments, the etching selectivity is greater than or equal to 100. The step 138 may implement wet etching, dry etching, or a combination thereof. For example, a wet etching process that implements an $NH_4OH$-based wet etching solution or an SC-1-based wet etching solution may be used for removing the HM layer 286. For example, the capping layer 284 may be removed by a wet etching process that implements a wet etching solution containing $H_2O_2$, an SC-2 (standard clean-2) based wet etching solution, or an SPM (sulfuric peroxide mix) based wet etching solution. The capping layer 284 may also be removed by a dry etching process that implements $NF_3$, $BCl_3$, $HBr$, $Cl_2$, $CF_4$, $SF_6$, other gases, or a mixture thereof. Parameters of the etching process (such as etching temperature, etching solution concentration, etching time, other suitable wet etching parameters, or combinations thereof) are controlled to ensure complete removal of the HM layer 286 and the capping layer 284 in the region 200A with minimal (to no) etching of the high-k dielectric layer 282. In some embodiments, the etching process partially etches the patterned coating layer 288.

Figure 10:
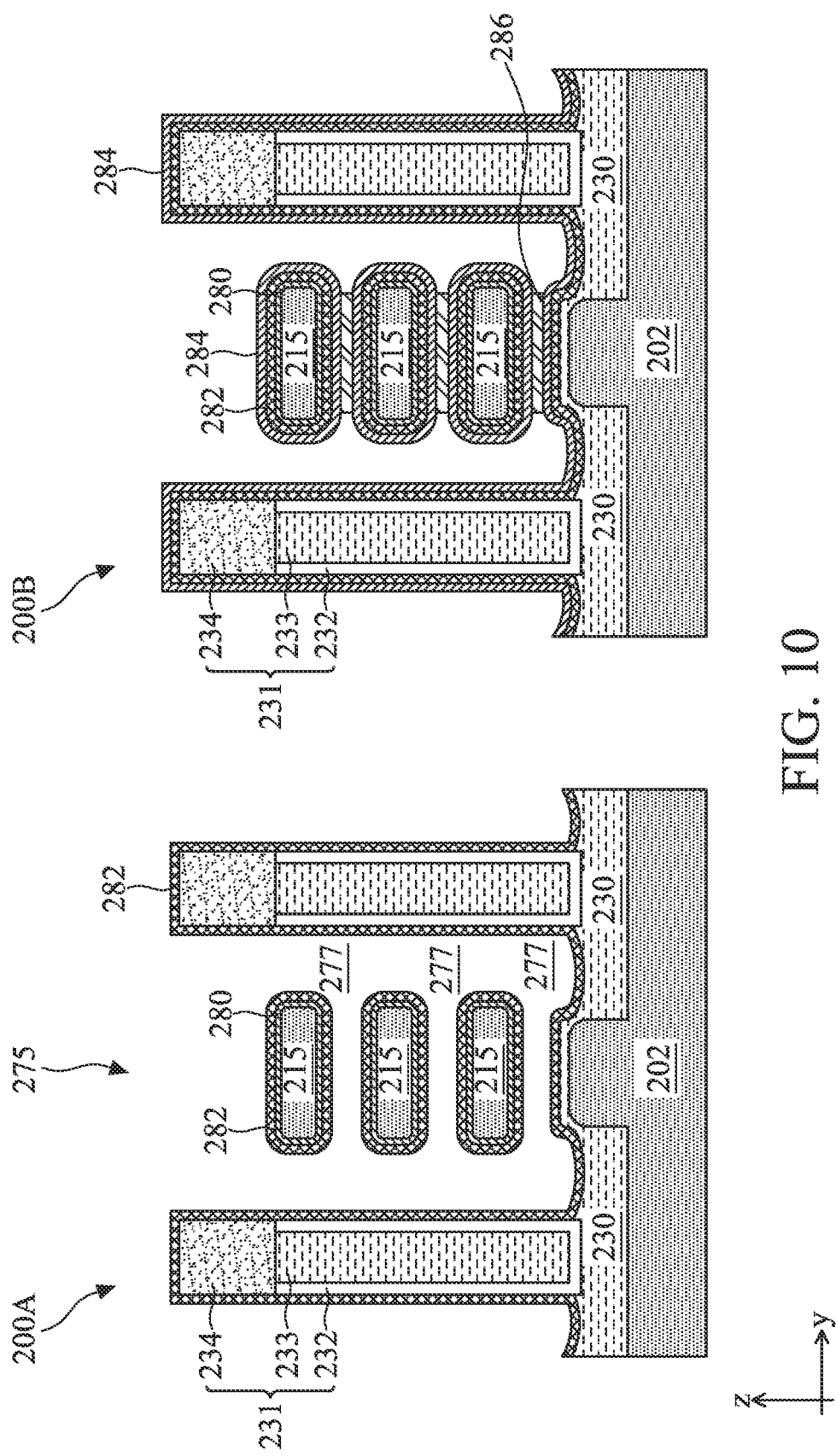

At step 140, the operation 110 (FIG. 1B) removes the patterned coating layer 288, for example, using stripping or ashing. The resultant structure is shown in FIG. 10 according to an embodiment. The capping layer 284 and the HM layer 286 are exposed in the region 200B.

Figure 11:
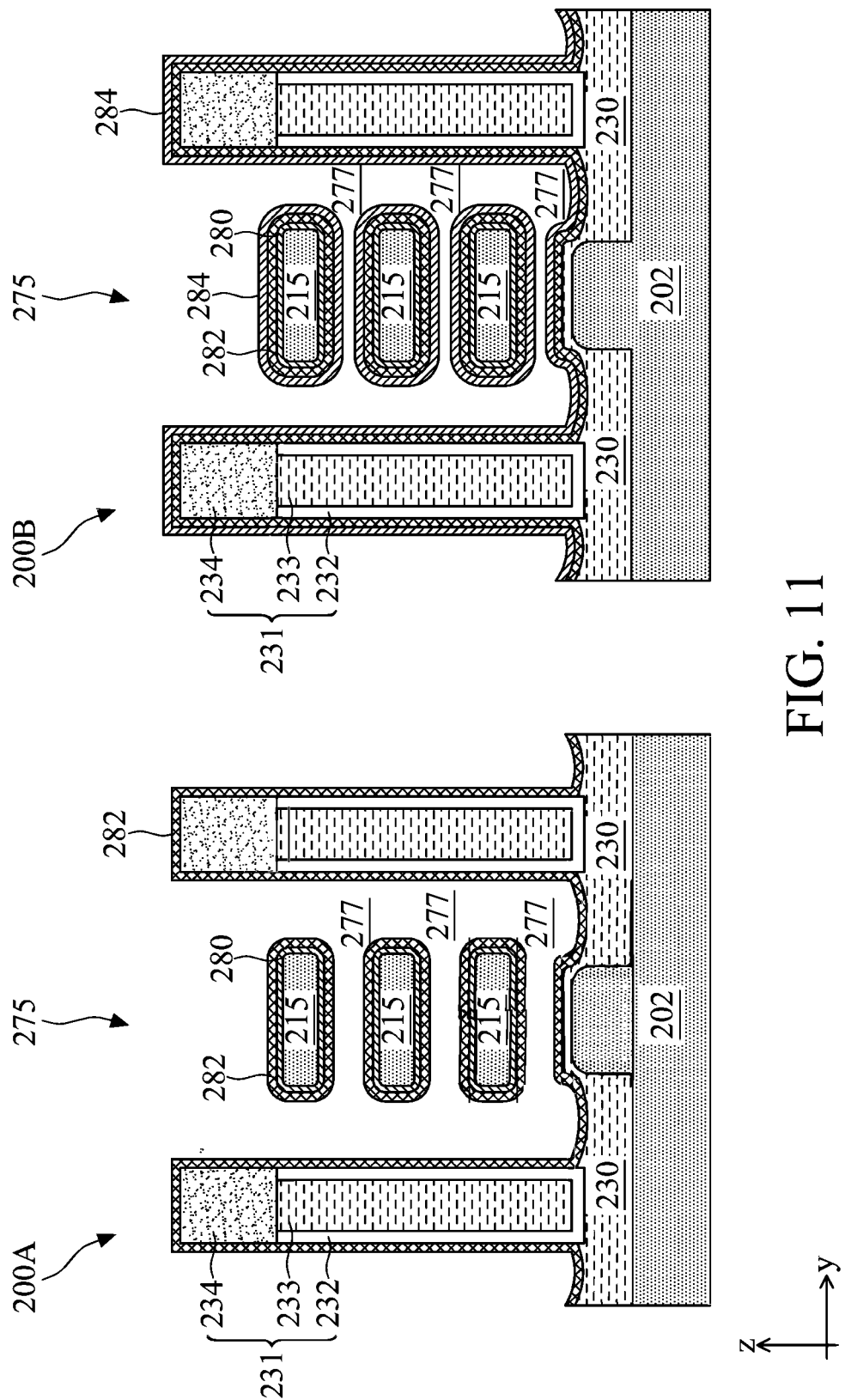

At step 142, the operation 110 (FIG. 1B) removes the remaining portions of the HM layer 286 from the region 200B. The resultant structure is shown in FIG. 11 according to an embodiment. In some embodiments, the etching process is a wet etching process or a dry etching that uses etchants having a high etching selectivity with respect to the HM layer 286 relative to the capping layer 284 and the high-k dielectric layer 282. In some embodiments, the etchants exhibit an etching selectivity (i.e., a ratio of an etch rate of the HM layer 286 to an etch rate of the capping layer 284 and the high-k dielectric layer 282 in the etching solution) of about 100 or more. In some embodiments, the step 142 uses a wet etching process that implements an $NH_4OH$-based wet etching solution. In some embodiments, the step 142 uses a wet etching process that implements an SC-1-based wet etching solution, where the SC-1 solution includes de-ionized water, ammonia, and hydrogen peroxide at a suitable ratio to achieve the etch selectivity discussed above. In some embodiments, the step 142 uses a dry etching process that uses fluorine-based etching gases, chlorine-based etching gases, bromine-based etching gases, or other suitable etching gases. For example, the dry etching process may use $NF_3$, $BCl_3$, HBr, or other suitable etching gases. Parameters of the etching process (such as etching temperature, etching solution concentration, etching gas flow rate, etching time, other suitable etching parameters, or combinations thereof) are controlled to remove the HM layer 286. By using the steps 130 through 142, the operation 110 patterns the capping layer 284 so that it is removed from the region 200A and is kept in the region 200B. Referring to FIG. 11, the capping layer 284 is kept over the high-k dielectric layer 282 in the region 200B and is removed from the region 200A.

Figure 12:
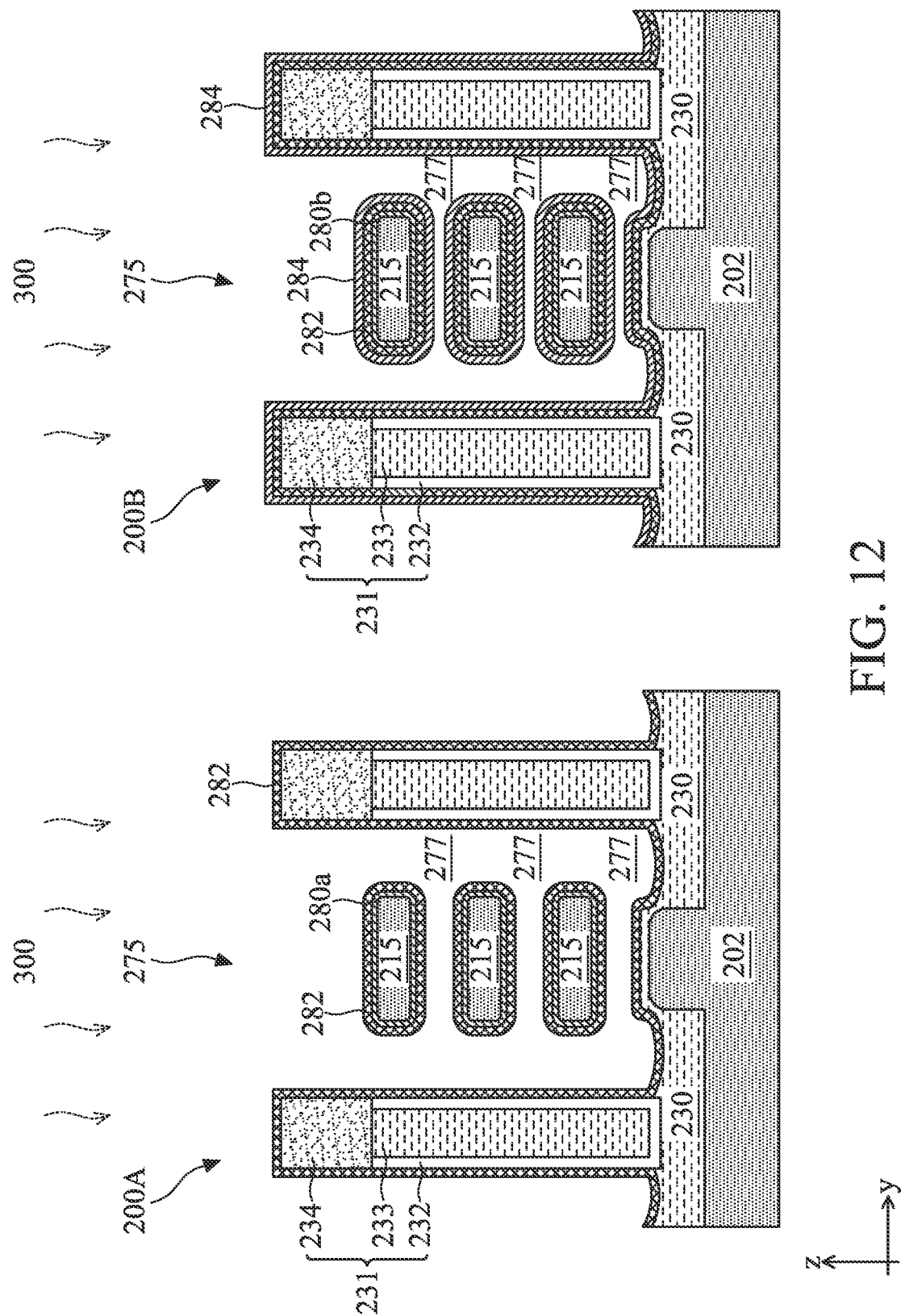
Figure 14:
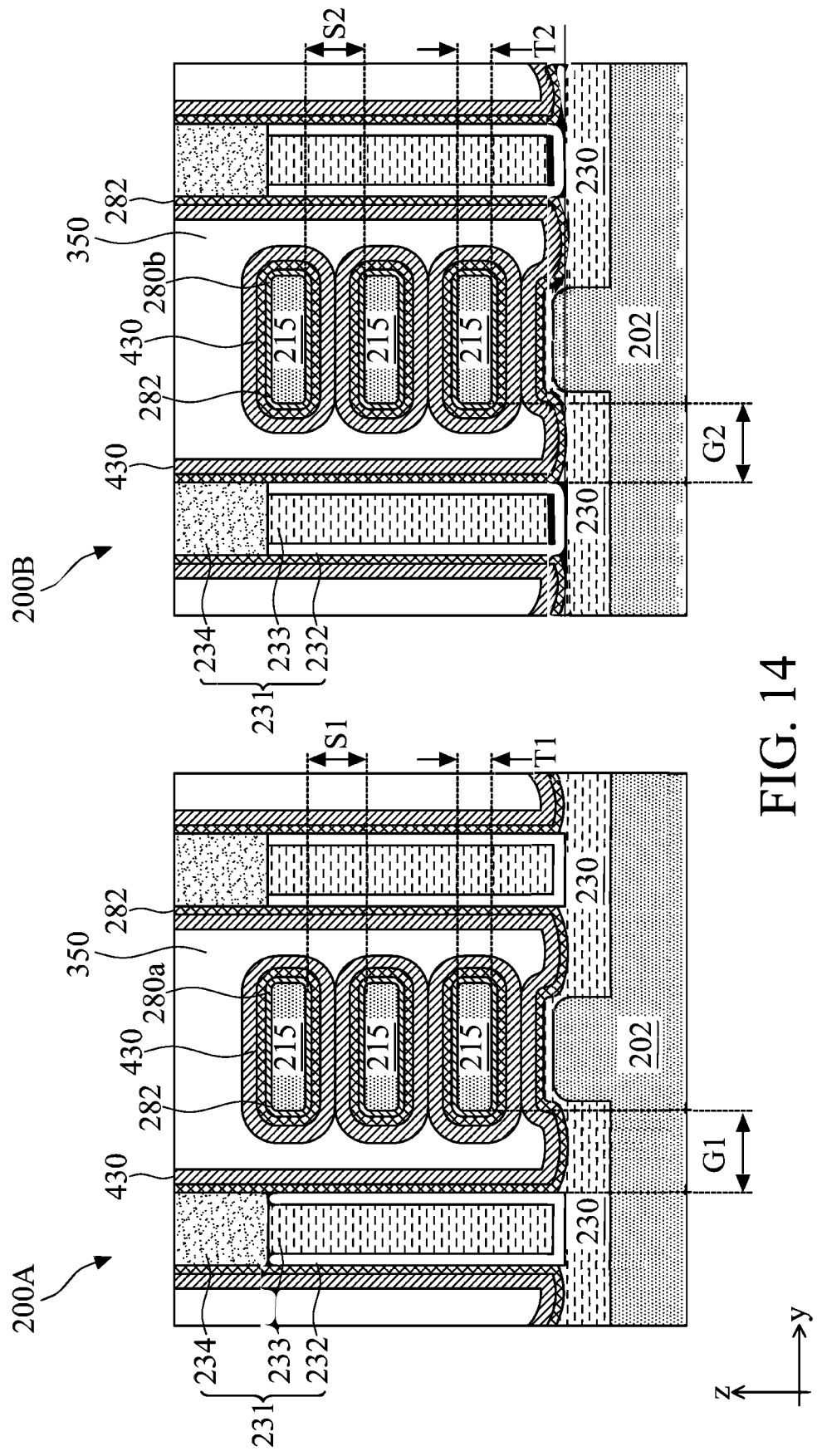

At operation 112, the method 100 (FIG. 1A) performs a thermal treatment 300 to the device 200, such as shown in FIG. 12. As will be discussed, due to the presence of the capping layer 284, the presence of oxygen ($O_2$) in the ambient, and the thermal treatment 300, the interfacial layer 280 in the region 200B is thickened. The thickened interfacial layer 280 in the region 200B is labeled as 280*b* in FIG. 12. The interfacial layer 280 in the region 200A is labeled as 280*a* in FIG. 12 to differentiate from the interfacial layer 280*b*. In some embodiments, the interfacial layer 280*a* may become slightly thicker than the interfacial layer 280 (prior to the operation 112) depending on the conditions of the thermal treatment 300. In some embodiments, the interfacial layer 280*b* is thicker than the interfacial layer 280 (prior to the operation 112) by about 2 Å to about 10 Å. In some embodiments, the interfacial layer 280*b* is thicker than the interfacial layer 280*a* (post the operation 112) by about 2 Å to about 10 Å. In some embodiments, after the thermal treatment 300 completes, the interfacial layer 280*b* has a thickness in a range from about 1.0 nm to about 2.0 nm. Such thickness is suitable for transistors performing IO functions, ESD functions, or high voltage functions. If the interfacial layer 280*b* is too thin (such as thinner than 1.3 nm), it might not be able to sustain the voltage applied to such transistors in some cases. If the interfacial layer 280*b* is too thick (such as thicker than 1.6 nm), there might not be enough room left between the channel layers 215 for the high-k dielectric layer 282 and the subsequently deposited work function metal layer 430 (FIG. 14).

In an embodiment, the thermal treatment 300 is a rapid thermal anneal (RTA) or a spike anneal process. For example, an RTA or spike anneal process can be used to anneal a single wafer (which holds the device 200) by rapidly ramping up a temperature using high-intensity lamp, a hot chuck, or a hot plate near the wafer. The temperature can be ramped up into a range from about 600° C. to about 1000° C. in seconds or even in milliseconds. In another embodiment, the thermal treatment 300 is a soak anneal process. For example, a single wafer (which holds the device 200) can be held at a temperature in a range from about 600° C. to about 1000° C. for duration in a range from about a few seconds to a few minutes. In yet another embodiment, the thermal treatment 300 is a furnace process. For example, multiple wafers (some of which holds the device 200) can be held in a furnace at a temperature in a range from about 300° C. to about 600° C. for duration in a range from about 30 minutes to about 3 hours. In any of the above embodiments, the wafer or wafers are annealed with oxygen ($O_2$) in the ambient surrounding the wafer or wafers (i.e., the wafer or wafers are annealed with ambient oxygen ($O_2$)). In some embodiment, the ambient further includes nitrogen ($N_2$) in addition to oxygen ($O_2$). For example, the ambient may have 99% oxygen ($O_2$) and 1% nitrogen ($N_2$), 1% oxygen ($O_2$) and 99% nitrogen ($N_2$), or other mixture of oxygen and nitrogen. In some embodiments, the ambient may include one or more noble gases in addition to oxygen ($O_2$).

As discussed earlier, the capping layer 284 includes an oxygen-scavenging material, which attracts ambient oxygen. During the thermal treatment 300, ambient oxygen is attracted to the region 200B; diffuses through the capping layer 284, the high-k dielectric layer 282, and the interfacial layer 280; and reacts with the semiconductor material(s) in the channel layers 215 (such as silicon) in the region 200B. The reaction increases the thickness of the interfacial layer 280. Since the capping layer 284 does not exist in the region 200A, there is negligible reaction (or much less reaction than in region 200B) between ambient oxygen and the semiconductor material(s) in the channel layers 215 in the region 200A. As a result of the semiconductor-oxygen reaction, the thickness of the interfacial layer 280 in the region 200B is increased. The amount of thickness increase can be finely tuned by adjusting the amount of ambient oxygen, the thermal treatment process (such as the anneal temperature and duration), the thickness of the capping layer, and so on. In an embodiment, the thickness of the interfacial layer 280 in the region 200B is increased by about 2 Å to about 10 Å. If the thickness increase is too small (such as less than 2 Å), there is insufficient thickness gain for IO functions (such as input/output and ESD) than for core functions. If the thickness increase is too big (such as more than 10 Å), then the remaining channel layers 215 might not provide sufficient channel width because the thickness of the channel layers 215 in the region 200B may be reduced by about twice of the amount of the thickness increase in the interfacial layer 280. For example, the thickness of the channel layers 215 in the region 200B may be reduced by 4 Å to about 20 Å along the "z" direction and by about 4 Å to about 20 Å along the "y" direction in various embodiments. In various embodiments, the high-k dielectric layer 282 in both the regions 200A and 200B is maintained at about the same location, thus the spacing 277 between the high-k dielectric layer 282 on adjacent channel layers 215 and on the substrate 202 stays about the same before and after the thermal treatment 300. Further, the horizontal spacing between the high-k dielectric layer 282 on the channel layers 215 and on the dielectric fins 231 stays about the same before and after the thermal treatment 300. Thus, embodiments of the present disclosure provide methods for forming interfacial layers with different thicknesses in different regions (such as in regions 200A and 200B) through a common process. Compared with approaches where interfacial layers in different regions are formed by different deposition processes and patterning processes, the present disclosure simplifies the manufacturing processes.

Figure 13:
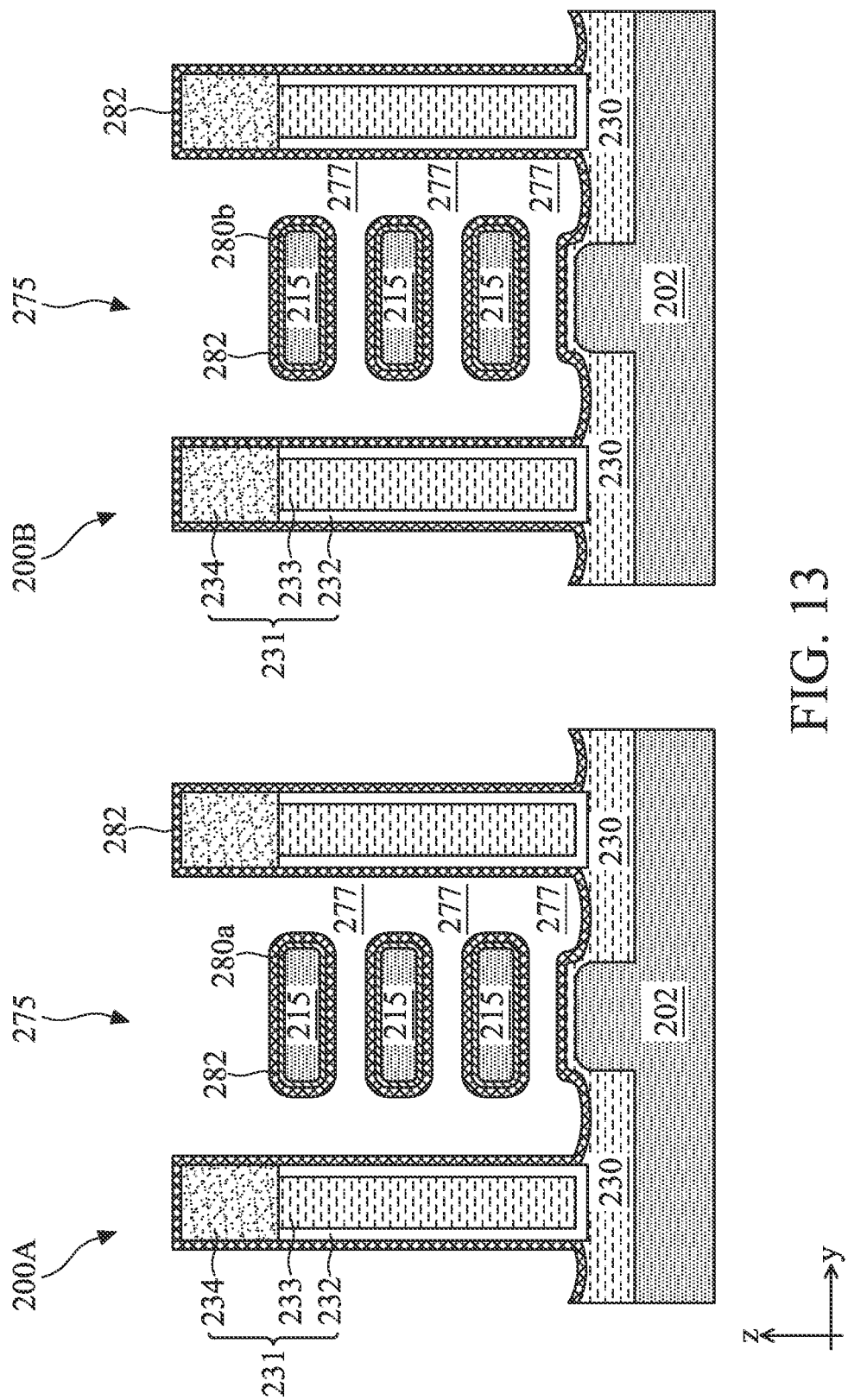

At operation 114, the method 100 (FIG. 1A) removes the capping layer 284 from the device 200. The resultant structure is shown in FIG. 13 according to an embodiment. Referring to FIG. 13, in the region 200A, the device 200 includes the channel layers 215, the interfacial layer 280a surrounding the channel layers 215, and the high-k dielectric layer 282 over the interfacial layer 280a and surrounding the channel layers 215. The high-k dielectric layer 282 over the adjacent channel layers 215 and between the bottommost channel layer 215 and the substrate 202 are separated by the space 277. The high-k dielectric layer 282 is also disposed directly on the surfaces of the dielectric fins 231. In the region 200B, the device 200 includes the channel layers 215, the interfacial layer 280b surrounding the channel layers 215, and the high-k dielectric layer 282 over the interfacial layer 280b and surrounding the channel layers 215. The high-k dielectric layer 282 over the adjacent channel layers 215 and between the bottommost channel layer 215 and the substrate 202 are separated by the space 277. The high-k dielectric layer 282 is also disposed directly on the surfaces of the dielectric fins 231.

At operation 116, the method 100 (FIG. 1A) forms a work function metal layer 430 over the high-k dielectric layer 282 and form a bulk metal layer 350 over the work function metal layer 430. The resultant structure is shown in FIG. 14 according to an embodiment. Referring to FIG. 14, in both the regions 200A and 200B, the work function metal layer 430 is deposited over the high-k dielectric layer 282 and surrounding each of the channel layers 215. The work function metal layer 430 is also disposed over the dielectric fins 231 and the isolation features 230. The portions of the work function metal layer 430 on the dielectric fins 231 are separated from the portions of the work function metal layer 430 on the channel layers 215 by a horizontal spacing which is filled by the bulk metal layer 350. In some embodiments, the work function metal layer 430 includes an n-type work function metal for n-type transistors, such as Ti, Al, Ag, Mn, Zr, TiC, TiAl, TiAlC, TiAlSiC, TaC, TaCN, TaSiN, TaAl, TaAlC, TaSiAlC, TiAlN, other n-type work function material, or combinations thereof. In some embodiments, the work function metal layer 430 includes a p-type work function metal for p-type transistors, such as TiN, TaN, TaSN, Ru, Mo, Al, WN, WCN, $ZrSi_2$, $MoSi_2$, $TaSi_2$, $NiSi_2$, other p-type work function material, or combinations thereof. In some embodiments, the work function metal layer 430 has a thickness of about 1 nm to about 4 nm. The work function metal layer 430 may be deposited using ALD, CVD, PVD, or other suitable processes. Since the gate trenches 275 (FIG. 13. Have sufficient room, the operation 116 may form different work function metal layers 430 in different regions (such as in regions 200A and 200B) or form different work function metal layers 430 for different transistors to provide different threshold voltages (such as standard Vt, lower Vt, higher Vt, etc.). The bulk metal layer 350 may be deposited using ALD, CVD, PVD, plating, or other suitable processes to fill any remaining portion of gate trenches 275. The bulk metal layer 350 includes a suitable conductive material, such as Al, W, and/or Cu. The bulk metal layer 350 may additionally or collectively include other metals, metal oxides, metal nitrides, other suitable materials, or combinations thereof. In some implementations, a blocking layer (not shown) is optionally formed (e.g., by ALD) over the work function layer 430 before forming the bulk metal layer 350, such that the bulk metal layer 350 is disposed on the blocking layer. After the bulk metal layer 350 is deposited, a planarization process may then be performed to remove excess gate materials from the device 200. For example, a CMP process is performed until a top surface of the dielectric fins 231 is reached (exposed).

As shown in FIG. 14, the channel layers 215 in the region 200A have a vertical thickness T1 and a channel-to-channel spacing S1, both along the "z" direction. Thus, the channel layers 215 in the region 200A have a vertical pitch (either center-to-center pitch or edge-to-edge pitch) of (T1+S1). The channel layers 215 in the region 200B have a vertical thickness T2 and a channel-to-channel spacing S2, both along the "z" direction. Thus, the channel layers 215 in the region 200B have a vertical pitch (either center-to-center pitch or edge-to-edge pitch) of (T2+S2). In some embodiment, the pitch T1+S1 is about the same as the pitch T2+S2. Further, the channel layers 215 are laterally spaced from the vertical surface of the dielectric fin 231 by a distance G1 in the region 200A and by a distance G2 in the region 200B, both along the "y" direction. In some embodiments, the spacing Si is in a range about 6 nm to about 12 nm, and the spacing S2 is greater than the spacing Si by about 4 Å to about 20 Å. In some embodiments, the thickness T1 is in a range about 4 nm to about 8 nm, and the thickness T2 is less than the thickness T1 by about 4 Å to about 20 Å. In some embodiments, the distance G1 is in a range from about 5 nm to about 30 nm, and the distance G2 is greater than the distance G1 by about 2 Å to about 10 Å.

At operation 118, the method 100 (FIG. 1A) performs further fabrication to the device 200. For example, the method 100 may form S/D contacts that electrically connect to the S/D features 260 (FIG. 2B), forming gate vias that electrically connect to the bulk metal layer 350, and forming multi-layer interconnects that connect the transistors and other components in the device 200 to form a complete IC.

Although not intended to be limiting, one or more embodiments of the present disclosure provide many benefits to a semiconductor device and the formation thereof. For example, using embodiments of the present disclosure, the thickness of interfacial gate dielectric layers in selected regions or transistors can be finely tuned to achieve small GAA devices. For another example, using embodiments of the present disclosure, the channel-to-channel spacing in GAA devices can be well maintained, leaving sufficient room for depositing work function metal layer(s). This enables multiple patterning gate (MPG) process to achieve multiple threshold voltages (Vt) in the same integrated circuit, such as standard Vt, lower Vt, higher Vt, etc. The present embodiments can be readily integrated into existing CMOS fabrication processes.

In one example aspect, the present disclosure is directed to a method that includes providing a structure having a substrate and a stack of semiconductor layers over a surface of the substrate and spaced vertically one from another; forming an interfacial layer wrapping around each of the semiconductor layers; forming a high-k dielectric layer over the interfacial layer and wrapping around each of the semiconductor layers; and forming a capping layer over the high-k dielectric layer and wrapping around each of the semiconductor layers. With the capping layer wrapping around each of the semiconductor layers, the method further includes performing a thermal treatment to the structure, thereby increasing a thickness of the interfacial layer. After the performing of the thermal treatment, the method further includes removing the capping layer.

In an embodiment, after the removing of the capping layer, the method further includes forming a work function metal layer over the high-k dielectric layer and wrapping around each of the semiconductor layers. In an embodiment, the method further includes forming a bulk metal layer over the work function metal layer.

In an embodiment of the method, the capping layer includes an oxygen-scavenging oxide or an oxygen-scavenging nitride, and the thermal treatment is performed with ambient oxygen ($O_2$). In a further embodiment, the capping layer includes one of TiN, TiSiN, $TiO_2$, TiON, TaN, and TiSiN. In another further embodiment, the thermal treatment is performed further with ambient nitrogen ($N_2$).

In some embodiments of the method, the thermal treatment increases the thickness of the interfacial layer by about 2 Å to about 10 Å. In some embodiments of the method, the thermal treatment is spike annealing or soak annealing at temperature in a range from about 600° C. to about 1,000° C. In some embodiments of the method, the thermal treatment is furnace annealing at temperature in a range from about 300° C. to about 600° C.

In another example aspect, the present disclosure is directed to a method that includes forming first nanostructures in a first region over a substrate; forming second nanostructures in a second region over the substrate; forming an interfacial layer wrapping around the first nanostructures and the second nanostructures; forming a high-k dielectric layer over the interfacial layer and wrapping around the first nanostructures and the second nanostructures; forming a capping layer over the high-k dielectric layer and wrapping around the first nanostructures and the second nanostructures; and removing the capping layer in the first region to expose the high-k dielectric layer in the first region while keeping the capping layer over the high-k dielectric layer in the second region. The method further includes performing a thermal treatment to the first nanostructures and the second nanostructure, wherein the interfacial layer in the second region becomes thicker than the interfacial layer at the first region after the thermal treatment is performed. After the thermal treatment, the method further includes removing the capping layer in the second region.

In some embodiments, the removing of the capping layer in the first region includes forming a hard mask layer filling space between the first nanostructures and filling space between the second nanostructures; forming a coating layer over the first and the second regions; patterning the coating layer into a patterned coating layer that exposes the first region and covers the second region; using the patterned coating layer as an etch mask, removing the hard mask layer and the capping layer from the first region; removing the patterned coating layer; and after the removing the patterned coating layer, removing the hard mask layer from the second region.

In some embodiments, the hard mask layer includes one of aluminum oxide, silicon nitride, lanthanum oxide, silicon, silicon carbonitride, silicon oxy-carbonitride, aluminum nitride, aluminum oxynitride.

In some embodiments, the first region is a core region of an integrated circuit, and the second region is an IO region of the integrated circuit. In some embodiments, the thermal treatment is performed with ambient oxygen ($O_2$) and the capping layer includes an oxygen-scavenging oxide or an oxygen-scavenging nitride. In a further embodiment, the capping layer includes one of TiN, TiSiN, $TiO_2$, TiON, TaN, and TiSiN.

In yet another example aspect, the present disclosure is directed to a semiconductor structure. The semiconductor structure includes first nanostructures vertically spaced one from another over a substrate in a first region of the semiconductor structure; a first interfacial layer wrapping around each of the first nanostructures; a first high-k dielectric layer over the first interfacial layer and wrapping around each of the first nanostructures; a first work function metal layer over the first high-k dielectric layer and wrapping around each of the first nanostructures; second nanostructures vertically spaced one from another over the substrate in a second region of the semiconductor structure; a second interfacial layer wrapping around each of the second nanostructures; a second high-k dielectric layer over the second interfacial layer and wrapping around each of the second nanostructures; and a second work function metal layer over the second high-k dielectric layer and wrapping around each of the second nanostructures, wherein a first thickness of the first interfacial layer is smaller than a second thickness of the second interfacial layer by about 2 Å to about 10 Å.

In an embodiment of the semiconductor structure, a vertical dimension of one of the first nanostructures is greater than a vertical dimension of one of the second nanostructures by about 4 Å to about 20 Å. In another embodiment, the first nanostructures are spaced one from another by a vertical distance in a range from about 6 nm to about 12 nm, and the second nanostructures are spaced one from another by a vertical distance in a range from about 6 nm to about 12 nm. In yet another embodiment, a first vertical pitch of the first nanostructures is about equal to a second vertical pitch of the second nanostructures.

In an embodiment, the semiconductor structure further includes two first dielectric fins disposed on opposite sides of the first nanostructures, wherein a first outer surface of the two first dielectric fins includes a material that is different from a material in the first interfacial layer, and the first high-k dielectric layer directly contacts the first outer surface. The semiconductor structure further includes two second dielectric fins disposed on opposite sides of the second nanostructures, wherein a second outer surface of the two second dielectric fins includes a material that is different from a material in the second interfacial layer, and the second high-k dielectric layer directly contacts the second outer surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a structure having a substrate and a stack of semiconductor layers over a surface of the substrate and spaced vertically one from another;
   forming an interfacial layer wrapping around each of the semiconductor layers;
   forming a high-k dielectric layer over the interfacial layer and wrapping around each of the semiconductor layers;
   forming a capping layer over the high-k dielectric layer and wrapping around each of the semiconductor layers;
   with the capping layer wrapping around each of the semiconductor layers, performing a thermal treatment to the structure, thereby increasing a thickness of the interfacial layer, wherein the capping layer includes an oxygen-scavenging oxide or an oxygen-scavenging nitride, and the thermal treatment is performed with ambient oxygen ($O_2$); and
   after the performing of the thermal treatment, removing the capping layer.

2. The method of claim 1, after the removing of the capping layer, further comprising:
   forming a work function metal layer over the high-k dielectric layer and wrapping around each of the semiconductor layers.

3. The method of claim 2, further comprising:
   forming a bulk metal layer over the work function metal layer.

4. The method of claim 1, wherein the capping layer includes one of TiN, TiSiN, $TiO_2$, TiON, TaN, and TiSiN.

5. The method of claim 1, wherein the thermal treatment is performed further with ambient nitrogen ($N_2$).

6. The method of claim 1, wherein the thermal treatment increases the thickness of the interfacial layer by about 2 Å to about 10 Å.

7. The method of claim 1, wherein the thermal treatment is spike annealing or soak annealing at temperature in a range from about 600° C. to about 1,000° C.

8. The method of claim 1, wherein the thermal treatment is furnace annealing at temperature in a range from about 300° C. to about 600° C.

9. The method of claim 1, wherein the capping layer is the outmost layer over each of the semiconductor layers during the thermal treatment.

10. The method of claim 1, wherein the capping layer is formed such that there is vertical space between the capping layer on adjacent semiconductor layers.

11. A method, comprising:
    forming first nanostructures in a first region over a substrate;
    forming second nanostructures in a second region over the substrate;
    forming an interfacial layer wrapping around the first nanostructures and the second nanostructures;
    forming a high-k dielectric layer over the interfacial layer and wrapping around the first nanostructures and the second nanostructures;
    forming a capping layer over the high-k dielectric layer and wrapping around the first nanostructures and the second nanostructures, wherein the capping layer is formed such that there is vertical space between the capping layer on adjacent first nanostructures and there is vertical space between the capping layer on adjacent second nanostructures;
    removing the capping layer in the first region to expose the high-k dielectric layer in the first region while keeping the capping layer over the high-k dielectric layer in the second region;
    performing a thermal treatment to the first nanostructures and the second nanostructures, wherein the interfacial layer in the second region becomes thicker than the interfacial layer in the first region after the thermal treatment is performed; and
    after the thermal treatment, removing the capping layer in the second region.

12. The method of claim 11, wherein the removing of the capping layer in the first region includes:
    forming a hard mask layer filling space between the first nanostructures and filling space between the second nanostructures;
    forming a coating layer over the first and the second regions;
    patterning the coating layer into a patterned coating layer that exposes the first region and covers the second region;
    using the patterned coating layer as an etch mask, removing the hard mask layer and the capping layer from the first region;
    removing the patterned coating layer; and
    after the removing the patterned coating layer, removing the hard mask layer from the second region.

13. The method of claim 12, wherein the hard mask layer includes one of aluminum oxide, silicon nitride, lanthanum oxide, silicon, silicon carbonitride, silicon oxy-carbonitride, aluminum nitride, aluminum oxynitride.

14. The method of claim 11, wherein the thermal treatment is performed with ambient oxygen ($O_2$) and the capping layer includes an oxygen-scavenging oxide or an oxygen-scavenging nitride.

15. The method of claim 14, wherein the capping layer includes one of TiN, TiSiN, $TiO_2$, TiON, TaN, and TiSiN.

16. The method of claim 11, wherein the capping layer is the outmost layer in the second region during the thermal treatment.

17. A semiconductor structure, comprising:
   first nanostructures vertically spaced one from another over a substrate in a first region of the semiconductor structure;
   a first interfacial layer wrapping around each of the first nanostructures;
   a first high-k dielectric layer over the first interfacial layer and wrapping around each of the first nanostructures;
   a first work function metal layer over the first high-k dielectric layer and wrapping around each of the first nanostructures;
   second nanostructures vertically spaced one from another over the substrate in a second region of the semiconductor structure;
   a second interfacial layer wrapping around each of the second nanostructures;
   a second high-k dielectric layer over the second interfacial layer and wrapping around each of the second nanostructures;
   a second work function metal layer over the second high-k dielectric layer and wrapping around each of the second nanostructures, wherein a first thickness of the first interfacial layer is smaller than a second thickness of the second interfacial layer by about 2 Å to about 10 Å;
   two first dielectric fins disposed on opposite sides of the first nanostructures, wherein a first outer surface of the two first dielectric fins includes a material that is different from a material in the first interfacial layer, and the first high-k dielectric layer directly contacts the first outer surface; and
   two second dielectric fins disposed on opposite sides of the second nanostructures, wherein a second outer surface of the two second dielectric fins includes a material that is different from a material in the second interfacial layer, and the second high-k dielectric layer directly contacts the second outer surface.

18. The semiconductor structure of claim 17, wherein a vertical dimension of one of the first nanostructures is greater than a vertical dimension of one of the second nanostructures by about 4 Å to about 20 Å.

19. The semiconductor structure of claim 17, wherein the first nanostructures are spaced one from another by a vertical distance in a range from about 6 nm to about 12 nm, and the second nanostructures are spaced one from another by a vertical distance in a range from about 6 nm to about 12 nm.

20. The semiconductor structure of claim 17, wherein a first vertical pitch of the first nanostructures is about equal to a second vertical pitch of the second nanostructures.

\* \* \* \* \*